United States Patent
Wang et al.

(10) Patent No.: US 11,328,757 B2
(45) Date of Patent: May 10, 2022

(54) TOPOLOGICAL MATERIAL FOR TRAPPING CHARGE AND SWITCHING A FERROMAGNET

(71) Applicant: Regents of the University of Minnesota, Minneapolis, MN (US)

(72) Inventors: Jian-Ping Wang, Shoreview, MN (US); Protyush Sahu, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 17/078,764

(22) Filed: Oct. 23, 2020

(65) Prior Publication Data

US 2021/0125651 A1 Apr. 29, 2021

Related U.S. Application Data

(60) Provisional application No. 62/925,423, filed on Oct. 24, 2019.

(51) Int. Cl.
| | | |
|---|---|---|
| *G11C 11/16* | (2006.01) | |
| *H01L 43/02* | (2006.01) | |
| *H01L 43/10* | (2006.01) | |
| *H01L 27/22* | (2006.01) | |

(52) U.S. Cl.
CPC ........ *G11C 11/161* (2013.01); *G11C 11/1675* (2013.01); *H01L 27/222* (2013.01); *H01L 43/02* (2013.01); *H01L 43/10* (2013.01)

(58) Field of Classification Search
CPC . G11C 11/1675; G11C 11/161; G11C 11/005; G11C 11/673; G11C 11/18; G11C 11/54; G11C 11/5607; G11C 11/565; H01L 27/222; H01L 43/02; H01L 43/10; H01L 43/08; G06N 3/049; G06N 3/0635
See application file for complete search history.

(56) References Cited

U.S. PATENT DOCUMENTS

| | | | |
|---|---|---|---|
| 9,024,415 B2 * | 5/2015 | Zhang | H01F 1/401 257/629 |
| 10,283,561 B2 | 5/2019 | Wang et al. | |
| 10,490,731 B2 * | 11/2019 | Sasaki | H01F 10/329 |
| 10,497,416 B2 * | 12/2019 | Sayed | G11C 11/1675 |
| 10,586,579 B2 * | 3/2020 | Wang | H01F 41/307 |
| 10,720,572 B1 * | 7/2020 | Fitelson | G11C 11/1659 |
| 11,107,901 B2 * | 8/2021 | Lien | H01L 27/11582 |

(Continued)

OTHER PUBLICATIONS

Analytis et al., "Two-dimensional surface state in the quantum limit of a topological insulator," Nature Physics, vol. 6, Dec. 2010, pp. 960-964.

(Continued)

*Primary Examiner* — Tri M Hoang
(74) *Attorney, Agent, or Firm* — Shumaker & Sieffert, P.A.

(57) ABSTRACT

In some examples, a device includes a dielectric material, a ferromagnetic material, and a topological material positioned between the dielectric material and the ferromagnetic material. The device is configured to trap electric charge inside the dielectric material or at an interface of the dielectric material and the topological material. The device is configured to switch a magnetization state of the ferromagnetic material based on a current through the topological material or based on a voltage in the topological material.

20 Claims, 14 Drawing Sheets

(56) References Cited

U.S. PATENT DOCUMENTS

| | | | | |
|---|---|---|---|---|
| 2020/0341079 | A1* | 10/2020 | Swerts | G01R 33/098 |
| 2020/0395406 | A1* | 12/2020 | Walker | H01L 43/10 |
| 2021/0104663 | A1* | 4/2021 | Haq | H01L 43/10 |

OTHER PUBLICATIONS

Xu et al., "Observation of topological suface state quantum Hall effect in an intrinsic three-dimensional topological insulator," Nature Physics, vol. 10, Sep. 2014, pp. 956-963.

Vandenberghe et al., "Imperfect two-dimensional topological insulator field-effect transistors," Nature Communications, vol. 8, Jan. 20, 2017, 8 pp.

Moore et al., "Topological invariants of time-reversal-invariant band structures," Physics Review B, vol. 75, Iss. 12 121306(R), Mar. 2017, 4 pp.

Kim et al., "Surface Scattering via Bulk Continuum States in the 3D Topological Insulator Bi2Se3," Physical Review Letters, vol. 107, Iss. 5, Jul. 29, 2011, 5 pp.

Rusmann et al., "Lifetime and surface-to-bulk scattering off vacancies of the topological surface state in the three-dimensional strong topological insulators Bi2Te3 and Bi2Se3," Journal of Physics and Chemistry of Solids, vol. 128, May 1, 2019, pp. 258-264.

Claro et al., "Self-assembled Bismuth Selenide (Bi2Se3) quantum dots grown by molecular beam epitaxy," Scientific Reports, vol. 9, No. 3370, Mar. 4, 2019, 7 pp.

Dc et al., "Room-temperature perpendicular magnetization switching through giant spin-orbit torque from sputtered BixSe(1-x) topological insulator material," Europe PMC, Nature Materials, vol. 17, Iss. 9, Sep. 2018, pp. 755-757.

Sahu et al., "Charge trapping analysis in sputtered BixSE1-x based accumulation-mode FETs," AIP Advances, vol. 10, 015315, Jan. 9, 2020, 7 pp.

Sun et al., "Preparation of Few-Layer Bismuth Selenide by Liquid-Phase-Exfoliation and Its Optical Absorption Properties," Scientific Reports, vol. 4, No. 4794, Apr. 24, 2014, 9 pp.

Sahu et al., "Weak antilocalization and low-temperature characterization of sputtered polycrystalline bismuth selenide," Applied Physics Letters, vol. 112, 122402, Mar. 19, 2018, 6 pp.

Sahu et al., "Charge trapping analysis in sputtered BixSe1-x based accumulation-mode FETs. II. Gate capacitance characteristics," AIP Advances, vol. 11, 015221, Jan. 8, 2021, 6 pp.

Wang et al., "Observation of Floquet-Bloch States on the Surface of a Topological Insulator," ScienceMag, Science, vol. 342, Oct. 25, 2013, pp. 453-457.

Wang et al., "Surface-State-Dominated Spin-Charge Current Conversion in Topological-Insulator-Ferromgnetic-Insulator Heterostructures," American Physical Society, Physical Review Letters, vol. 117, 076601, DOI: 10.1103/PhysRevLett. 117.076601, Aug. 12, 2016, 5 pp.

Han et al., "Room-Temperature Spin-Orbit Torque Switching Induced by a Topological Insulator," American Physical Society, Physical Review Letters, vol. 119, 077702, DOI: 10.1103/PhysRevLett.119. 077702, Aug. 18, 2017, 5 pp.

Toporov et al., "Mechanisms of scattering of surface electrons in topological insulators," Low Temperature Physics, vol. 45, No. 118, https://doi.org/10.1063/1.5082322 Jan. 22, 2019, pp. 134-139.

U.S. Appl. No. 16/861,869, by Regents of the University of Minnesota (Inventors: Wang et al.), filed Apr. 29, 2020.

Khatib et al., "Aging Analysis of Datapath Sub-blocks Based on CET Map Model for Negative Bias Temperature nstability (NBTI)," ResearchGate, A Thesis Presented to the Faculty of Nile University, Egypt, Jan. 2014, 89 pp.

Rana, "New Method for Diagnostic of Ion Implantation Induced Charge Carrier Traps in Micro- and Nanoelectric Devices," Scientific Research, World Journal of Nuclear Science and Technology, vol. 2, Oct. 2012, pp. 174-180.

Kang et al., "Modeling and Exploration of the Voltage Controlled Magnetic Anisotropy Effect for the Next-Generation Low-Power and High-Speed MRAM Applications," ResearchGate, IEEE Transactions on Nanotechnology, vol. 16, Issue 3, Doi: 10.1109/TNAN0. 2017.2660530, Jan. 27, 2017, pp. 387-395.

Zhao et al., "Low writing energy and sub nanosecond spin torque transfer switching of in-plane magnetic tunnel unction for spin torque transfer random access memory," American Institute of Physics, Journal of Applied Physics, vol. 109, 07C720, Mar. 29, 2011, 3 pp.

Larrieu et al., "Sub-15 nm gate-all-around field effect transistors on vertical silicon nanowires," Elsevier, ScienceDirect, Solid-State Electronics, vol. 130, Jan. 6, 2017, pp. 9-14.

Guerfi et al., "Vertical Silicon Nanowire Field Effect Transistors with Nanoscale Gate-All-Around," Springer Open, Nanoscale Research Letters, vol. 11, No. 210, DOI 10.1186/s11671-016-1396-7, Apr. 19, 2016, 7 pp.

Wu et al., "Spin-polarized charge trapping cell based on a topological insulator quantum dot," Royal Society of Chemistry, RSC Advances, vol. 7, DOI: 10.1039/c7ra03482b, May 26, 2017, pp. 30963-30969.

Sahu et al., "Weak antilocalization and low-temperature characterization of sputtered polycrystalline bismuth selenide," Applied Physics Letters, vol. 112, https://doi.org/10.1063/1.5020788, Mar. 19, 2018, pp. 112402-5.

Avci et al., "Unidirecitonal spin Hall magnetroresistence in ferromagnet/ normal metal bilayers," Macmillan Publishers Limited, Nature Physics, vol. 11, DOI: 10.1038/NPHYS3356, Jul. 2015, pp. 570-575.

Lv et al., "Unidirectional spin-Hall and Rashba-Edelstien magnetoresistance in topological insulator-ferromagnet layer heterostructures," Nature Communications, vol. 9, No. 111, DOI: 10.1038/s41467-017-02491-3, Jan. 9, 2018, 7 pp.

Lu et al., "Spin-Torque Switching with the Giant Spin Hall Effect of Tantalum," Science Mag, Science, vol. 336, DOI: 10.1126/science. 1218197, May 4, 2012, pp. 555-558.

Kang et al., "Modeling and Exploration of the Voltage-Controlled Magnetic Anistropy Effect for the Next-Generation Low-Power and High-Speed MRAM Applications," IEEE Transactions on Nanotechnology, vol. 16, No. 3, May 2017, pp. 387-395.

Li et al., Investigation of gate leakage current mechanism in AlGaN/GaN high-electron mobility transistors with sputtered TiN, Journal of Applied Physics, vol. 121, https://doi.org/10.1063/1. 4974959, Jan. 26, 2017, pp. 044504-7.

Roy et al., "Leakage Current Mechanisms and Leakage Reduction Techniques in Deep-Submicrometer CMOS Circuits," Proceedings of the IEEE, vol. 91, No. 2, DOI:10.1109/JPROC.2002.808156, Feb. 2003, pp. 305-326.

Dc et al., "Room-temperature high spin-orbit torque due to quantum confinement in sputtered BixSe(1-x) films," Nature Materials, vol. 17, https://doi.org/10.1038/s41563-018-0136-z, Sep. 2018, pp. 800-807.

Dc et al., "Room-temperature spin-to-charge conversion in sputtered bismuth selenide thin films via spin pumping from yttrium iron garnet," Applied Physics Letters, vol. 114, https://doi.org/10.1063/ 1.5054806, Mar. 12, 2019, pp. 102401-5.

Weber et al., "Dangling bonds and vacancies in germanium," Physical Review B, vol. 87, 10.1103/PhysRevB.87.035203, Jan. 14, 2013, pp. 035203-9.

Kriegner et al., "Twin domain imaging in topological insulator Bi2Te2 and Bi2Se3 epitaxial thin films by scanning X-ray nanobeam microscopy and electron backscatter diffraction," Journal of Applied Crystallography, vol. 50, https://doi.org/10.1107/S1600576717000565, Jan. 11, 2017, pp. 369-377.

Gushterov et al., "Extraction of Trap-Assisted Tunneling Parameters by Graphical Method in Thin n-Si/SiO2 Structures," Journal of Optoelectronics and Advanced Materials, vol. 7, No. 3, Jun. 2005, pp. 1389-1393.

* cited by examiner

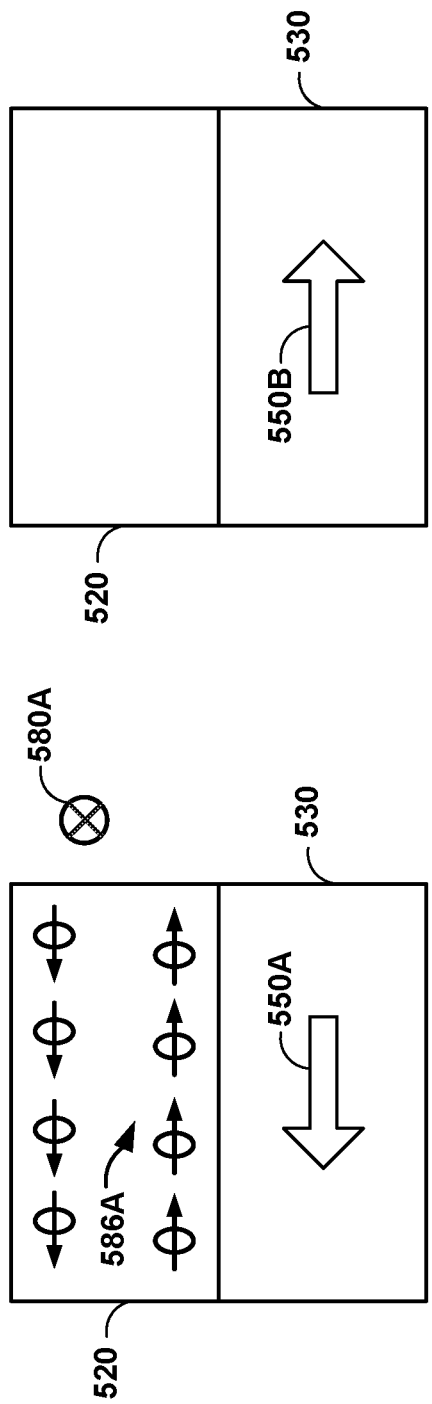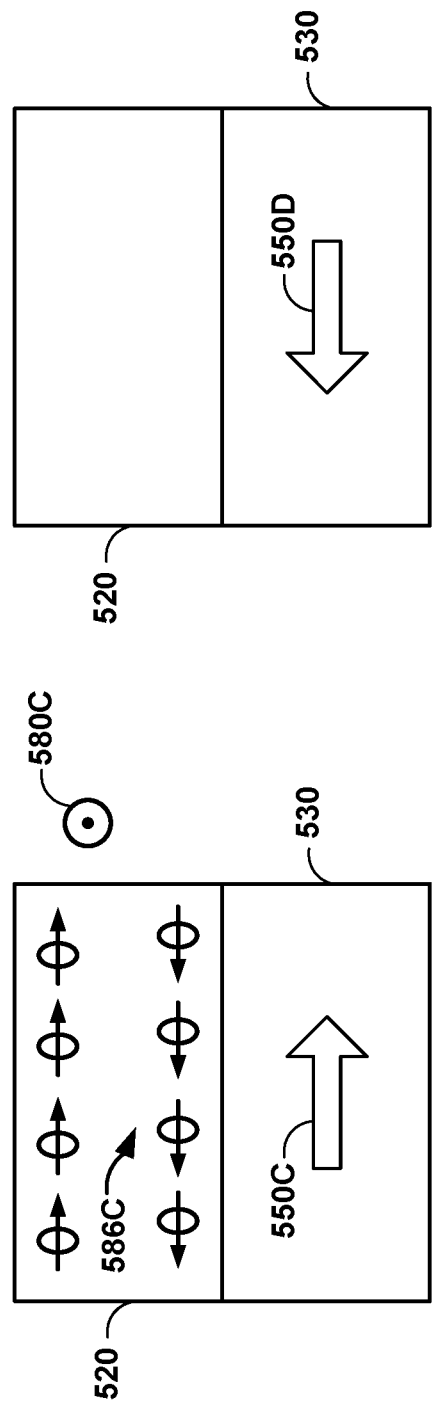

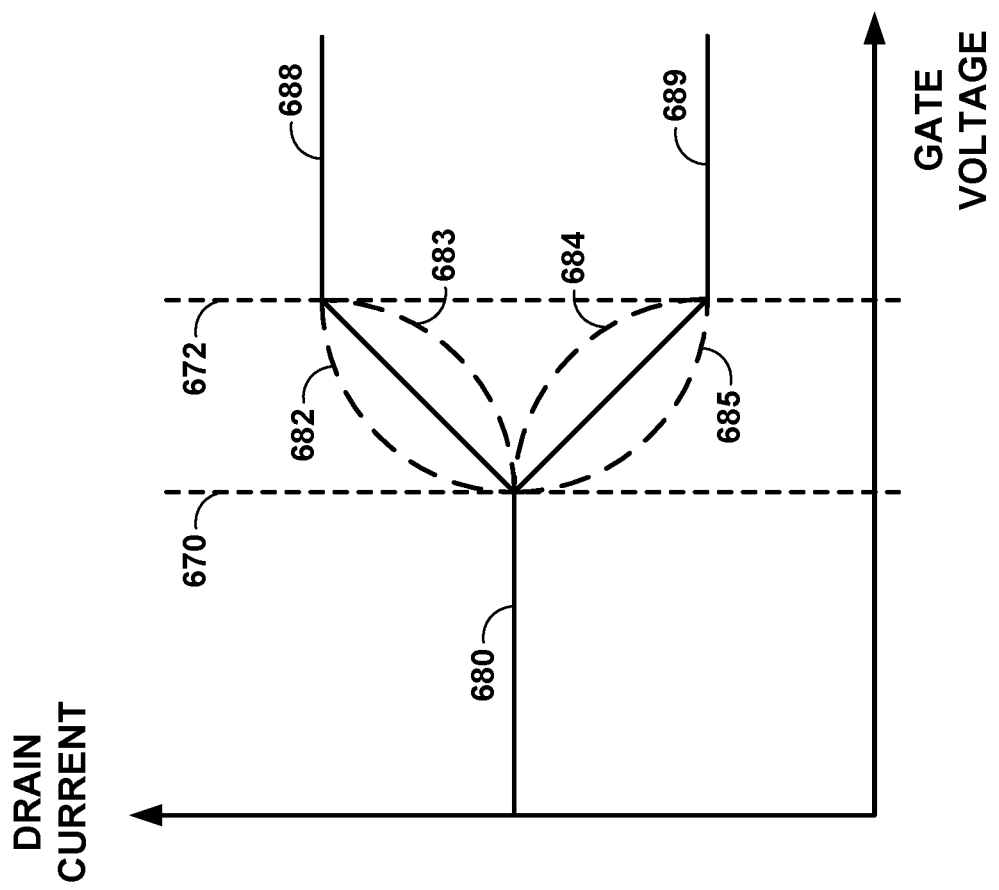
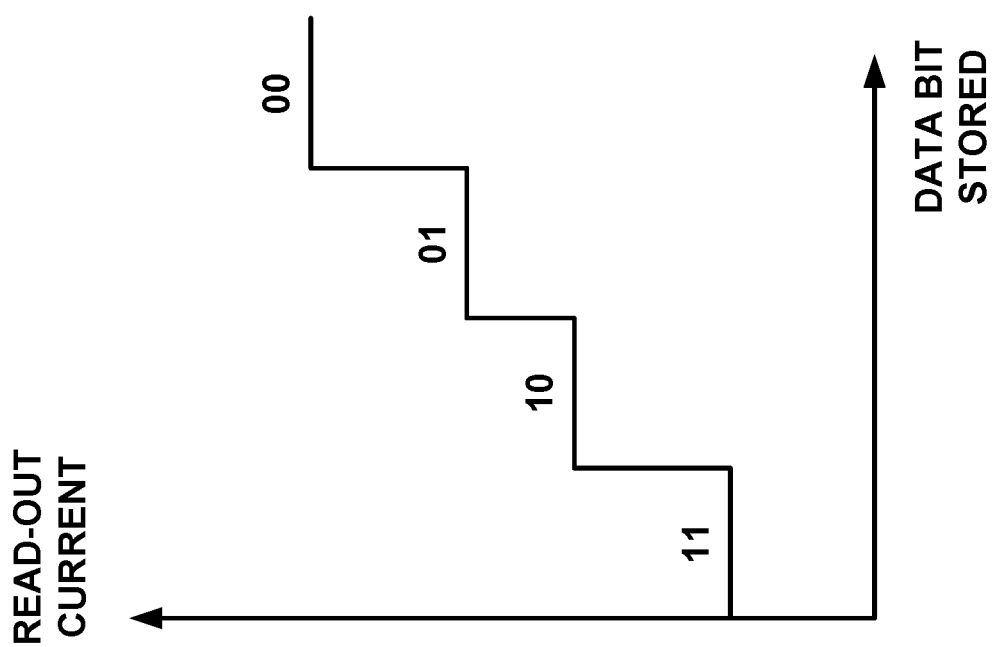
FIG. 6B
FIG. 6A

TOPOLOGICAL MATERIAL FOR TRAPPING CHARGE AND SWITCHING A FERROMAGNET

This application claims the benefit of U.S. Provisional Patent Application No. 62/925,423 (filed Oct. 24, 2019), the entire content of which is incorporated herein by reference.

GOVERNMENT INTEREST

This invention was made with government support under Grant No. HR0011-18-3-0004 awarded by the Department of Defense/Defense Advanced Research Projects Agency (DARPA). The government has certain rights in the invention.

TECHNICAL FIELD

This disclosure relates to memory and logic devices.

BACKGROUND

Non-volatile memory stores data even after power has been removed. One way to operate non-volatile memory is by using a charge-trap transistor where electric charges (e.g., electrons or holes) can be stored in the gate dielectric and/or in the channel material.

SUMMARY

This disclosure describes techniques for storing two data bits using a dielectric material, a topological material, and a ferromagnetic material. A first bit may be stored using electric charges trapped inside the dielectric material or at an interface of the dielectric material and the topological material. A second bit may be stored in the magnetization state of the ferromagnetic material. The reading and writing techniques for each of one or more devices may be based on each device's specific operation, stack design, and transport physics. The fabrication of each device of the one or more devices may be completed using a complementary metal-oxide-semiconductor (CMOS) compatible process. The techniques of this disclosure can be used for neuromorphic computing applications because the trapped charges can operate similar to an analog synapse and because the ferromagnetic material can operate similar to a stochastic synapse and/or a neuron.

In some examples, a device includes a dielectric material, a ferromagnetic material, and a topological material positioned between the dielectric material and the ferromagnetic material. The device is configured to trap electric charge inside the dielectric material or at an interface of the dielectric material and the topological material. The device is configured to switch a magnetization state of the ferromagnetic material based on a current through the topological material or based on a voltage in the topological material. The topological material may include a topological insulator, a Weyl semimetal, a Dirac semimetal, or any combination thereof. The topological material can be in either a crystalline state or an amorphous state.

In some examples, a method for operating a memory device includes writing a first bit to the memory device by modulating a gate voltage to trap electric charge inside a dielectric material or at an interface of the dielectric material and a topological material. The method also includes writing a second bit to the memory device by modulating a drain voltage to switch a magnetization state of a ferromagnetic material. The method further includes reading the first bit and the second bit based on a current through the topological material.

In some examples, a device includes gate contact, a dielectric layer, a ferromagnetic layer, and a topological layer positioned between the dielectric layer and the ferromagnetic layer. The dielectric layer is positioned between the gate contact and the topological layer, and the topological layer comprises a material selected from a group consisting of bismuth selenide, bismuth tellurium, antimony selenide, and antimony tellurium. The device is configured to trap electric charge at an interface of the dielectric layer and the topological layer based on a voltage applied to the gate contact. The device is also configured to switch a magnetization state of the ferromagnetic layer based on a spin current generated in the topological layer.

BRIEF DESCRIPTION OF DRAWINGS

FIGS. 5A-5D are conceptual diagrams of write operations to switch the magnetization of a ferromagnetic material, in accordance with examples of the disclosure.

FIGS. 6A and 6B are graphs of current through a topological material based on the data bits stored in a memory device, in accordance with examples of the disclosure.

DETAILED DESCRIPTION

Figure 1:
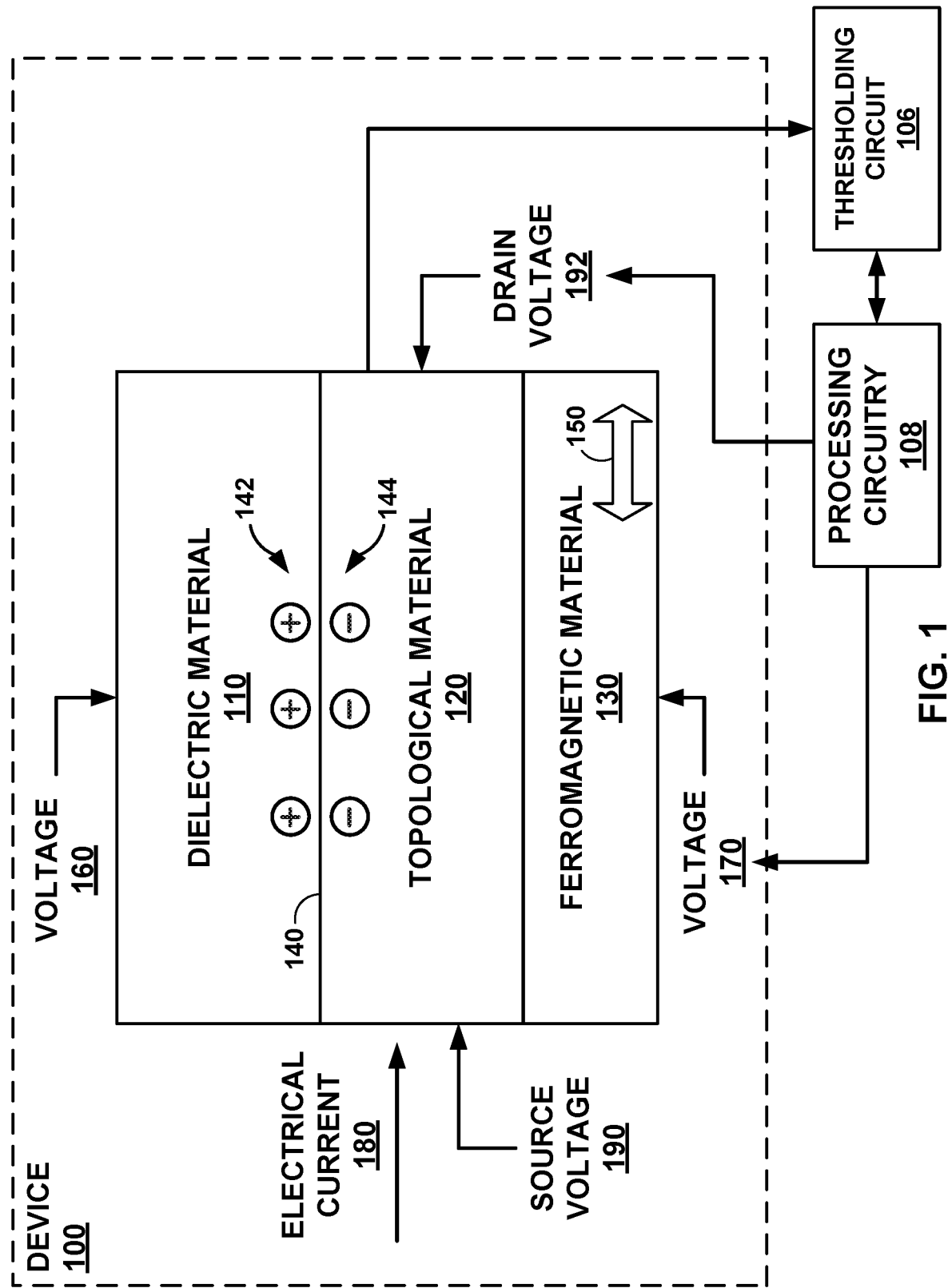
FIG. 1 is a conceptual block diagram of a charge-trap transistor device including a topological material and a ferromagnetic material, in accordance with examples of the disclosure.

This disclosure describes examples of hybrid charge-trap transistors that can store two data bits using a topological material positioned between a dielectric material and a ferromagnetic material. A first data bit can be represented by the charges (or lack thereof) trapped inside the dielectric material or at an interface of the dielectric material and the topological material. In some examples, processing circuitry is configured to write the first data bit by modulating a gate voltage across the dielectric material. A second data bit can be represented by the magnetization state of the ferromagnetic material. In some examples, processing circuitry is configured to write the second data bit by modulating a source voltage and/or a drain voltage, e.g., modulating a drain-source voltage across the TI-material channel of the hybrid charge-trap transistor. The processing circuitry may be configured to read the first and second data bits using a current through the topological material.

An existing charge-trap transistor stores a data bit based on charge that is trapped in a dielectric material of the charge-trap transistor. Existing magnetoresistive random-access memory (MRAM) stores a data bit based on the magnetization state of ferromagnetic material in the MRAM. This disclosure describes example techniques for a way in which one device includes both a charge-trap transistor and MRAM for simultaneously storing two bits in one device. As one example, the same topological material can be utilized to store a bit in a charge-trap transistor and utilized to store a bit in the MRAM by switching the magnetization of a ferromagnet.

For example, a topological material can be positioned between the dielectric material of the charge-trap transistor and the ferromagnetic material of the MRAM. The topological material can act as the semi-conductive channel for the charge-trap transistor. The same topological material can also act as the spin Hall effect material for the MRAM. Thus, a hybrid charge-trap transistor of this disclosure can store two or more data bits using a shared, common topological material for both the transistor portion and the MRAM portion of the hybrid charge-trap transistor.

The topological material may include a topological insulator, a Weyl semimetal, a Dirac semimetal, and/or any combination thereof. The topological material may include a material with a crystalline state or structure, a material with an amorphous state or structure, and/or any combination thereof. A topological insulator is any material that behaves as an insulator in the interior of the material but has more conductive states at the surface of the material. For example, the topological material may include a combination of bismuth (Bi), antimony (Sb), selenium (Se), and/or tellurium (Te). $Bi_xSe_{1-x}$, and more particularly $Bi_2Se_3$, can be used as a topological material in a hybrid charge-trap transistor. Topological material may include a dirty or disorganized lattice structure that allows for deep traps for storing charges. It may be difficult to remove an electric charge from a deep trap of the topological material, which allows for stable storage of a data bit in the charge-trap transistor. In addition, the topological material may be able to generate a strong spin current for switching the magnetization state of the ferromagnetic material of the MRAM because of the spin-orbit coupling of the topological material.

A topological field-effect transistor (FET) of this disclosure can be used as an electrical switch. The presence of a band gap allows for the manipulation of the electron concentration and for manipulation of the topologically protected spin states. The charge trap layer can pin or establish the Fermi level at the surface of the topological material, allowing the device to operate as depletion mode FET and/or as an enhancement mode FET, depending on the type of electric charge (e.g., electron or hole) that is trapped in the dielectric material.

FIG. 1 is a conceptual block diagram of a charge-trap transistor device 100 including a topological material 120 and a ferromagnetic material 130, in accordance with examples of the disclosure. As shown in FIG. 1, device 100 includes dielectric material 110, topological material 120, and ferromagnetic material 130, where topological material 120 is positioned between dielectric material 110 and ferromagnetic material 130.

Dielectric material 110 is insulating material that interfaces with topological material 120. Dielectric material 110 may include material as silicon dioxide, magnesium oxide, any other oxide, silicon nitride, and/or any other dielectric material. FIG. 1 depicts positive charges 142 in dielectric material 110 at interface 140 of dielectric material 110 and topological material 120. Positive charges 142 may form at interface 140 in response to processing circuitry 108 applying voltage 160 with a positive sign to a surface of dielectric material 110 that is opposite from interface 140. In examples in which voltage 160 has a negative sign, negative charges may accumulate in dielectric material 110 at interface 140 at locations where positive charges 142 are currently shown in FIG. 1.

Negative charges 144 may form in topological material 120 at interface 140 in response to processing circuitry 108 applying voltage 160 with a negative sign to a surface of dielectric material 110 that is opposite from interface 140. In examples in which voltage 160 has a negative sign, positive charges may accumulate in topological material 120 at interface 140 at locations where negative charges 144 are currently shown in FIG. 1. When processing circuitry 108 removes voltage 160 and there is zero voltage across dielectric material 110, some of the charges 142 and 144 may remain trapped at interface 140. Thus, device 100 may have memory of the previous polarity of voltage 160.

In examples in which negative charges 144 are trapped within topological material 120, electrical current 180 may have a larger amplitude when a drain-to-source voltage is applied across topological material 120 and when topological material 120 is n-type. If topological material 120 is n-type and positive charges are trapped within topological material 120, electrical current 180 may have a smaller amplitude. Charges 142 and 144 may affect whether device 100 operates in enhancement mode or depletion mode. If a sufficient number of charges are trapped at interface 140, device 100 may be configured to operate in depletion mode, where current 180 can flow through topological material 120 based on the drain-source voltage even when no voltage 160 is applied to dielectric material 110.

Charges 142 and 144 trapped at interface 140 allows for pinning the Fermi level of device 100. Depending on the pinning of the Fermi level, in examples in which electrons are trapped in dielectric material 110, device 100 may act as a depletion-mode FET. In examples in which positively charged holes are trapped in dielectric material 110, device 100 will act as an enhancement-mode FET. Thus, device 100 can be tuned between depletion mode and enhancement mode by changing the polarity of charge trapped at interface 140. In a spin FET, this change between enhancement mode and depletion mode can be performed by changing the configuration of source and drain ferromagnets (e.g., anti-parallel versus parallel). However, in device 100, trapping charges at interface 140 may be easier than changing the magnetization state of a ferromagnetic material, as done in a spin FET device.

To enable changing between depletion mode and enhancement mode, the operating range of voltage 160 should be less than the trap potential (e.g., approximately two volts). By modulating voltage 160 between, for example, negative two voltage and positive two volts, device 100 can be activated and deactivated. In addition, by applying a larger voltage magnitude for voltage 160, such as positive ten volts, the mode can be changed: positive ten volts can cause device 100 to operate in enhancement mode, and negative ten volts can cause device 100 to operate in depletion mode. To activate or deactivate device 100 (e.g., to activate or deactivate conduction in topological material 120), a smaller magnitude of voltage 160 can be applied.

Electrical current 180 can be used as the read-out for the data bit represented by the charges trapped at interface 140. A thresholding circuit may be configured to receive electrical current 180 and generate a first output in response to determining that an amplitude of electrical current 180 is greater than a threshold value (e.g., for a logical bit value of one). The thresholding circuit may be configured to generate a second output in response to determining that an amplitude of electrical current 180 is not greater than the threshold value (e.g., for a logical bit value of zero).

topological material 120 may include bismuth selenide, bismuth tellurium, antimony selenide, antimony tellurium, and/or any other topological insulator. $Bi_xSe_{1-x}$, and more particularly $Bi_2Se_3$, is a potential material for topological material 120 that can provide good trapping of charges 142 and 144 and good generation of spin current, as described in further detail below. Topological material 120 may be formed by sputtering, chemical vapor deposition (CVD), plasma enhanced CVD, molecular beam epitaxy, atomic layer deposition, evaporation deposition, and/or any other technique for forming a topological structure. In particular, sputtered $Bi_xSe_{1-x}$ may perform well as topological material 120 in device 100.

topological material 120 may contain ballistic high mobility surface carriers, which can be useful for high electron mobility transistors (HEMTs) and spintronics. One ingredient of the surface states is the topological protection, which is provided by time-reversal symmetry. The topological protection of topological material 120 can eliminate electron backscattering in some examples. Several other surface scattering processes can dominate, making the surface transport similar to bulk. A bottleneck for TIs is the high-quality thin film deposition/growth techniques used to obtain the topological protection. Polycrystalline films of topological material 120 grown by simple sputtering techniques can cause a quantum confinement that creates additional lowly dispersive bands, which are spin-momentum locked. These bands are surface bands, which exist at the corners of individual grains. The polycrystalline films of topological material 120 may exhibit a. Rashba effect resulting from the break in inversion symmetry. The presence of surface states within topological material 120 can create spin accumulation.

topological material 120 may be in direct contact with ferromagnetic material 130, or there may be one or more layers of other material positioned between topological material 120 and ferromagnetic material 130. For example, ferromagnetic material 130 may be part of a magnetic tunnel junction stack that includes one or more layers positioned between topological material 120 and ferromagnetic material 130.

Electrical current 180 may flow through topological material 120 based on the difference between source voltage 190 and drain voltage 192, which can be modulated by processing circuitry 108. When processing circuitry 108 injects electrical current 180 into topological material 120, topological material 120 may generate a spin current in a direction that is orthogonal to the interface of topological material 120 and ferromagnetic material 130. Topological material 120 may be selected to have the properties of a spin Hall effect material including generating a relatively strong spin current. The spin current may flow into ferromagnetic material 130 to switch magnetization state 150 of ferromagnetic material 130 from a first state to a second state. When processing circuitry 108 injects electrical current 180 into topological material 120 in a reverse direction, topological material 120 may generate a reverse spin current that switches magnetization state 150 back to the first state.

Optional voltage 170 may be connected to a reference voltage supply (e.g., a ground voltage). In some examples, voltages 190 and/or 192 may be connected to the reference voltage supply to supply the reference voltage to a source terminal and/or a drain terminal of topological material 120. In examples in which ferromagnetic material 130 is part of a magnetic tunnel junction stack and voltage 170 is connected to reference ground, the voltage across the magnetic tunnel junction stack can be modulated to switch magnetization state 150 using spin-transfer torque, voltage-controlled magnetic anisotropy, and/or voltage-controlled exchange coupling.

In accordance with the techniques of this disclosure, device 100 has three terminals (e.g., gate, drain, and source) and may be able to store two bits. In examples in which device 100 has three terminals, voltage 170 may be left unconnected or may be connected to source voltage 190. Thus, device 100 may have 1.5 terminals per bit. That is, device 100 may store 2 bits, and there are 3 terminals, and therefore, 1.5 terminals per bit. In contrast, existing charge-trap transistor has three terminals and can store one bit. An existing MRAM cell has two terminals and can store one bit. Therefore, existing techniques that utilize charge-trap transistor and MRAM cell would need 5 terminals to store 2 bits, or 2.5 terminals per bit. Topological material 120 may be configured to operate as a channel for a charge-trap transistor and as a spin Hall effect material for ferromagnetic material 130. In this way, topological material 120 may have unique properties that allow of topological material 120 to be used as a central material of device 100. The properties of topological material 120 may include a disorganized, bumpy lattice structure for creating deep traps and generating strong spin current for switching magnetization state 150.

Processing circuitry 108 may be configured to write a first bit to device 100 by modulating voltage 160 to trap electric charge inside at the interface of dielectric material 110 and topological material 120. For example, by applying voltage 160 with a positive sign, processing circuitry 108 can cause positive charges 142 to form inside dielectric material 110 at interface 140 and negative charges 144 to form inside topological material 120 at interface 140. Because of the disorganized lattice structure of topological material 120, topological material 120 may form deep traps at interface 140, serving as memory for the first bit.

Processing circuitry 108 may be configured to write a second bit to device 100 by modulating voltages 190, 192, and/or 170 to switch magnetization state 150 of ferromagnetic material 130. By modulating voltages 190 and/or 192, processing circuitry 108 may be able to inject electrical current 180 into topological material 120, which can generate a spin current inside topological material 120. The spin current inside topological material 120 can switch magnetization state 150 of ferromagnetic material 130. Additionally or alternatively, by modulating voltages 190 and/or 192, processing circuitry 108 may be configured to switch magnetization state 150 using spin transfer torque, voltage-controlled exchange coupling, and/or voltage-controlled magnetic anisotropy.

Processing circuitry 108 may be configured to read the first bit and the second bit based on electrical current 180 through topological material 120. For example, processing circuitry 108 may be configured to modulate drain voltage 192 to a predefined read voltage level. In some examples, processing circuitry 108 is configured to connect a drain terminal to thresholding circuit 106 so that thresholding circuit 106 can receive current 180. Thresholding circuit 106 may be configured to compare current 180 (or a voltage equivalent of current 180) to one or more threshold levels to determine values for the first and second data bits. Processing circuitry 108 may be configured to then determine the values stored as the first and second bits based on an output generated by thresholding circuit 106.

Although thresholding circuit 106 and processing circuitry 108 are depicted outside of device 100, thresholding circuit 106 and/or processing circuitry 108 may also be located partially or completely inside or integrated with device 100. The techniques attributed to processing circuitry 108 may be implemented, at least in part, in hardware, software, firmware or any combination thereof. For example, various aspects of the techniques may be implemented within one or more processors, including one or more microprocessors, digital signal processors (DSPs), application-specific integrated circuits (ASICs), field-programmable gate arrays (FPGAs), memory controllers, or any other equivalent integrated or discrete logic circuitry, as well as any combinations of such components, embodied in programmers, such as physician or patient programmers, stimulators, remote servers, or other devices. The term "processor" or "processing circuitry" may generally refer to any of the foregoing logic circuitry, alone or in combination with other logic circuitry, or any other equivalent circuitry.

Such hardware, software, firmware may be implemented within the same device and/or within separate devices to support the various operations and functions described in this disclosure. For example, any of the techniques or processes described herein may be performed within one device or at least partially distributed amongst two or more devices. In addition, any of the described units, modules or components may be implemented together or separately as discrete but interoperable logic devices.

The techniques described in this disclosure may also be embodied or encoded in an article of manufacture including a non-transitory computer-readable storage medium encoded with instructions. Instructions embedded or encoded in an article of manufacture including a non-transitory computer-readable storage medium encoded, may cause one or more programmable processors, or other processors, to implement one or more of the techniques described herein, such as when instructions included or encoded in the non-transitory computer-readable storage medium are executed by the one or more processors. Example non-transitory computer-readable storage media may include RAM, ROM, programmable ROM (PROM), erasable programmable ROM (EPROM), electronically erasable programmable ROM (EEPROM), flash memory, magnetic media, optical media, or any other computer readable storage devices or tangible computer readable media.

In some examples, a computer-readable storage medium comprises non-transitory medium. The term "non-transitory" may indicate that the storage medium is not embodied in a carrier wave or a propagated signal. In certain examples, a non-transitory storage medium may store data that can, over time, change (e.g., in RAM or cache). Elements and functionality of processing circuitry 108 may be programmed with various forms of software. The one or more processors may be implemented at least in part as, or include, one or more executable applications, application modules, libraries, classes, methods, objects, routines, sub-routines, firmware, and/or embedded code, for example.

Figure 2:
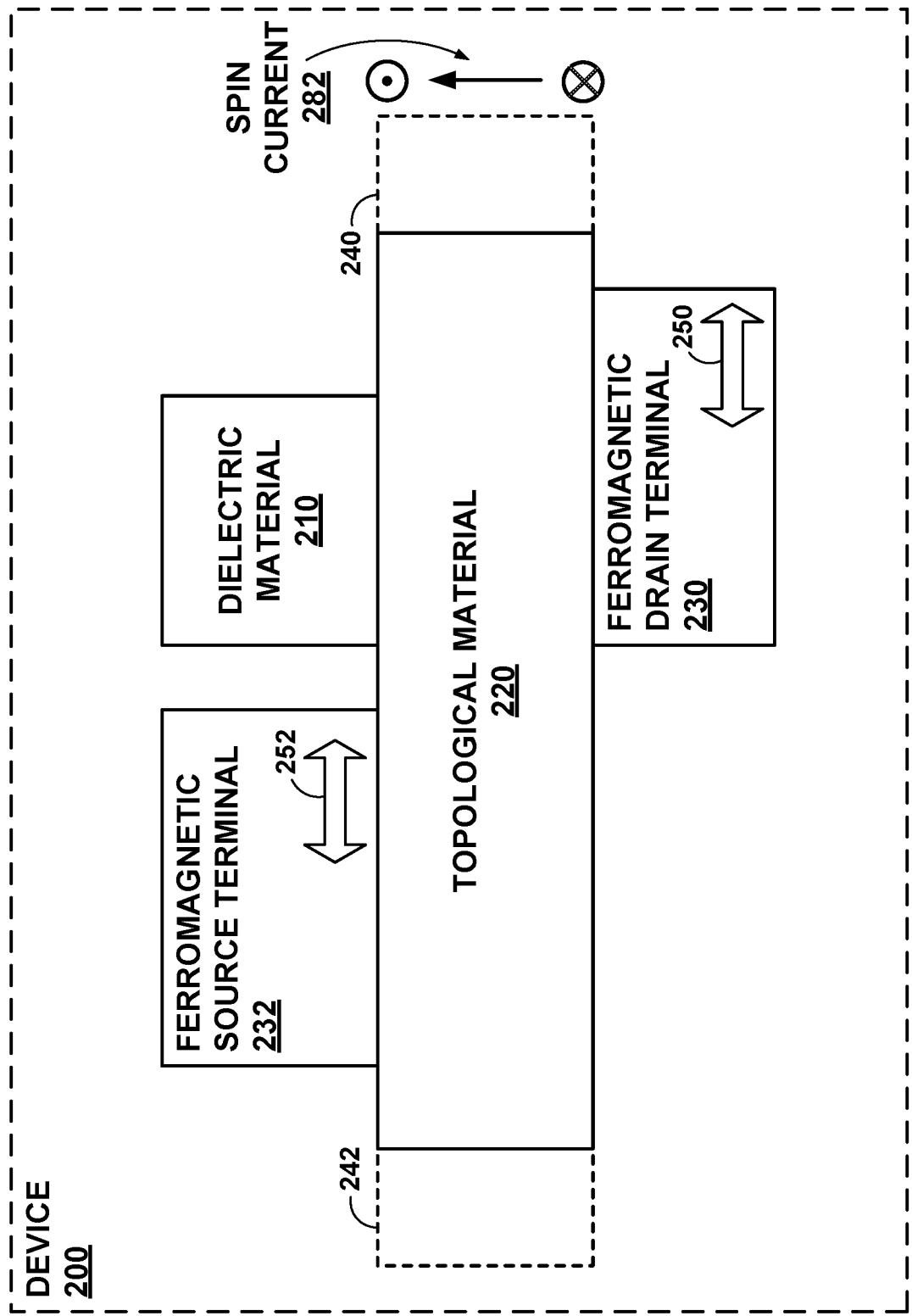
FIG. 2 is a conceptual block diagram of a charge-trap transistor device including two ferromagnetic terminals, in accordance with examples of the disclosure.

FIG. 2 is a conceptual block diagram of a charge-trap transistor device 200 including two ferromagnetic terminals 230 and 232, in accordance with examples of the disclosure. Ferromagnetic terminal 230 may be configured to act as a source terminal for charge-trap transistor device 200, and ferromagnetic terminal 232 may be configured to act as a drain terminal for charge-trap transistor device 200. Charge-trap transistor device 200 is an example of a vertical transistor where the drain-to-source current flows between terminals 230 and 232 through topological material 220.

In some examples, magnetization state 250 may be configured to switch between two states, and magnetization state 252 may be configured to remain constant. The switching of magnetization state 250 in the example shown in FIG. 2 may be sharp switching of device 200 with a quick, clean transition between states. Sharp switching can be a consequence of the low density of states, due to the quantum confinement effect. Thus, terminal 230 may be referred to as a free layer, and terminal 232 may be referred to as a fixed layer. In examples in which magnetization states 250 and 252 are parallel, the electrical current flowing between terminals 230 and 232 may experience relatively low resistance. This relatively low resistance, and the resulting high current, can represent a logical value of one stored by device 200. In examples in which magnetization states 250 and 252 are antiparallel, the electrical current flowing between terminals 230 and 232 may experience relatively high resistance. This relatively high resistance, and the resulting low current, can represent a logical value of zero stored by device 200.

The positioning of terminals 230 and 232 may allow for electrical current that flows between the top and bottom of device 200, as viewed from the perspective of FIG. 2, when the gate voltage applied to dielectric material 210 is greater than a threshold voltage. The electrical current flows between terminals 230 and 232 through topological material 220 based on a gate voltage applied to dielectric material 210. This vertical charge current can generate spin current 282 that effectively switches magnetization state 250. Spin current 282 generated by electrical current flowing between terminals 230 and 232, where a dot represents the spin polarization of electrons pointing out of plane, and a cross represents the spin polarization of electrons pointing into plane.

When charge current is injected from terminal 232, the charge current includes dot and cross currents at the same time. As the charge current flows horizontally through topological material 220, the charge current goes to the top or bottom of topological material 220 based on the spin polarization of the electron. Thus, the dot-polarized current moves to the top of topological material 220, and the cross-polarized current moves to the bottom of topological material 220. The polarized spin currents separate out, which results in spin current 282 in the vertical direction. Spin current 282 flows from the cross to dot in the example shown in FIG. 2.

Positions 240 and 242 are alternate positions for terminals 230 and 232, respectively. The positions show by terminals 230 and 232 represent a vertical layout, and positions 240 and 242 represent a lateral layout. Positions 240 and 242 for terminals 230 and 232 would make device 200 to be similar to a spin FET.

Figure 3:
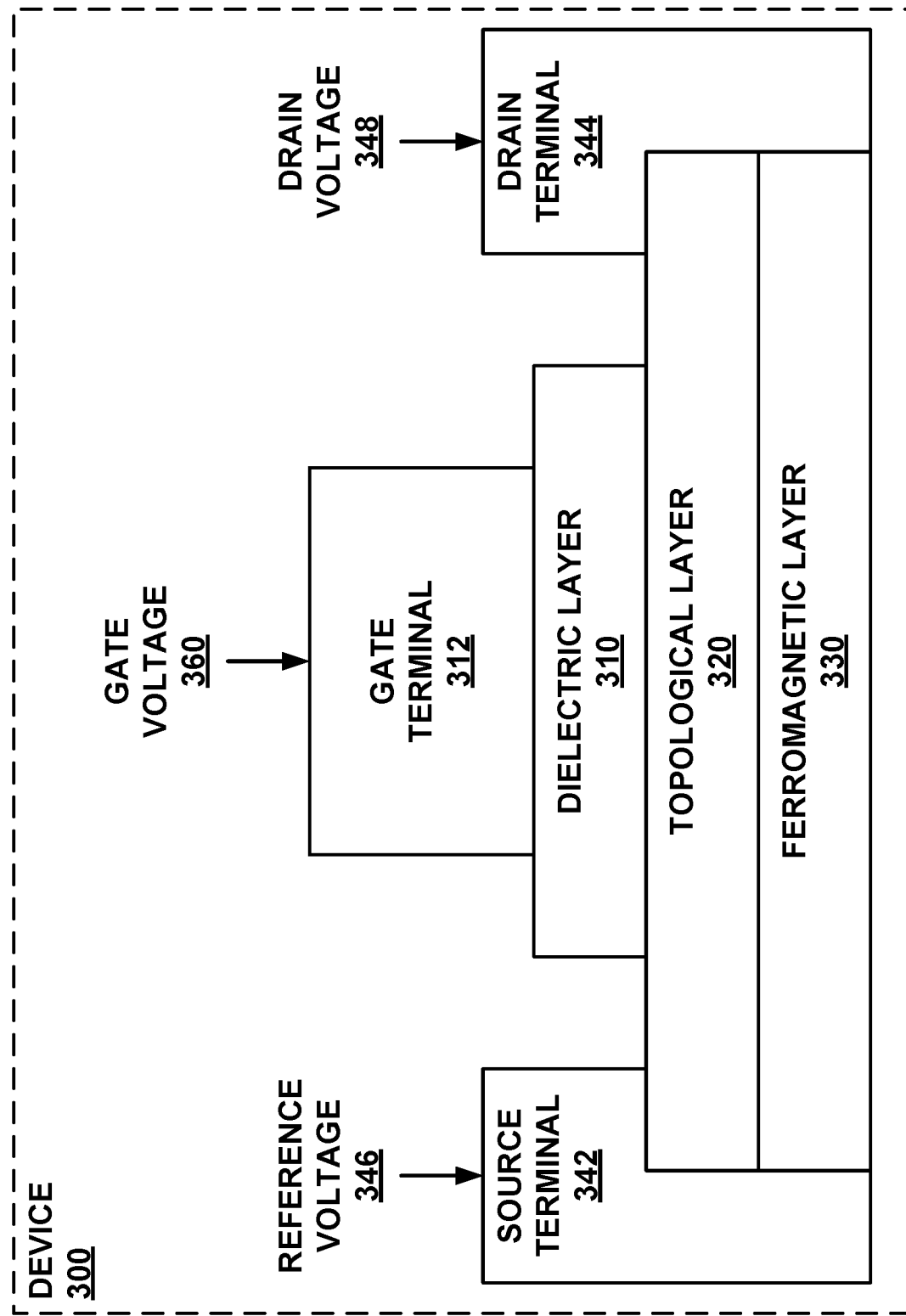
FIG. 3 is a conceptual block diagram of a lateral charge-trap transistor device including a ferromagnetic layer, in accordance with examples of the disclosure.

FIG. 3 is a conceptual block diagram of a lateral charge-trap transistor device 300 including a ferromagnetic layer 330, in accordance with examples of the disclosure. Charge-trap transistor device 300 also includes topological layer 320 positioned on ferromagnetic layer 330, dielectric layer 310 positioned on topological layer 320, gate terminal 312 positioned on dielectric layer 310. Charge-trap transistor device 300 further includes source terminal 342 and drain terminal 344 positioned at the ends of topological layer 320. In the example shown in FIG. 3, ferromagnetic material is positioned on the bottom of device 300, or at least beneath layers 310 and 320. Either the lateral implementation (e.g., device 300) or the vertical implementation (e.g., device 700 shown in FIGS. 7A and 7B) can be used as a spin-orbit coupling FET or as a spin FET.

Charge-trap transistor device 300 may be configured to store two data bits of information using three terminals for receiving voltages 346, 348, and 360. A first data bit of information can be stored based on charges trapped in dielectric layer 310 and/or at the interface of layers 310 and 320. A second data bit of information can be stored based on the magnetization state of ferromagnetic layer 330. Ferromagnetic layer 330 may include in-plane anisotropy material, meaning that the magnetization is oriented to the left or the right, although perpendicular anisotropy is also possible.

Processing circuitry may be configured to write the first data bit by modulating gate voltage 360 to trap or release charges from the interface of layers 310 and 320. Additionally or alternatively, the processing circuitry may be configured to write the second data bit by modulating voltage 348 to generate a spin current in topological layer 320. Thus, topological layer 320 may be a shared, common layer that is part of the charge-trap transistor that includes dielectric layer 310 and part of the magnetic memory that includes ferromagnetic layer 330. The spin current may cause the magnetization state of ferromagnetic layer 330 to switch. The processing circuitry may be configured to read the first data bit by modulating voltages 346 and 348 to cause an electrical current to flow between terminals 342 and 344. The amplitude of the electrical current will indicate the value stored as the first data bit.

Figure 4B:
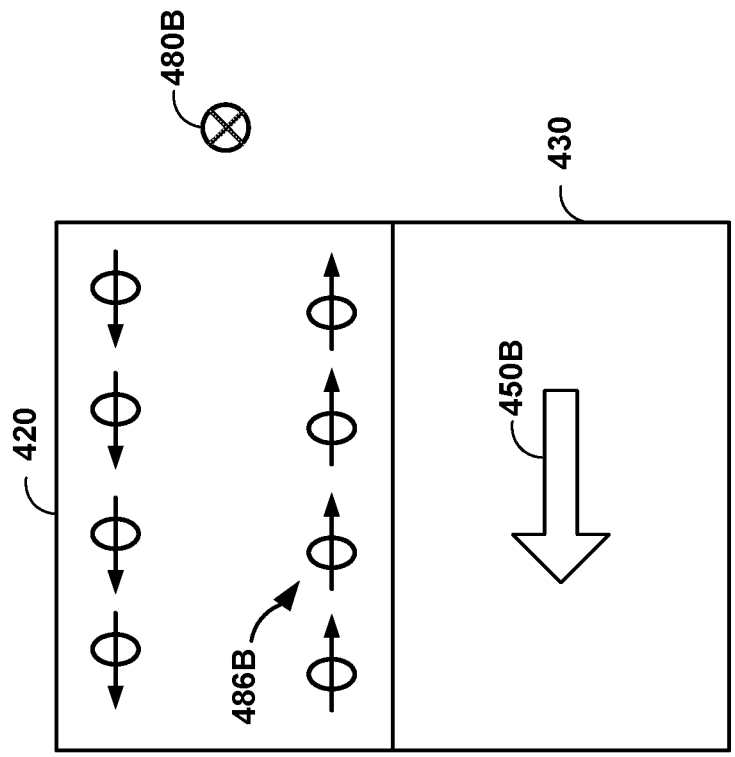
FIGS. 4A and 4B are conceptual diagrams of a read operation based on a current through a topological material, in accordance with examples of the disclosure.
Figure 4A:
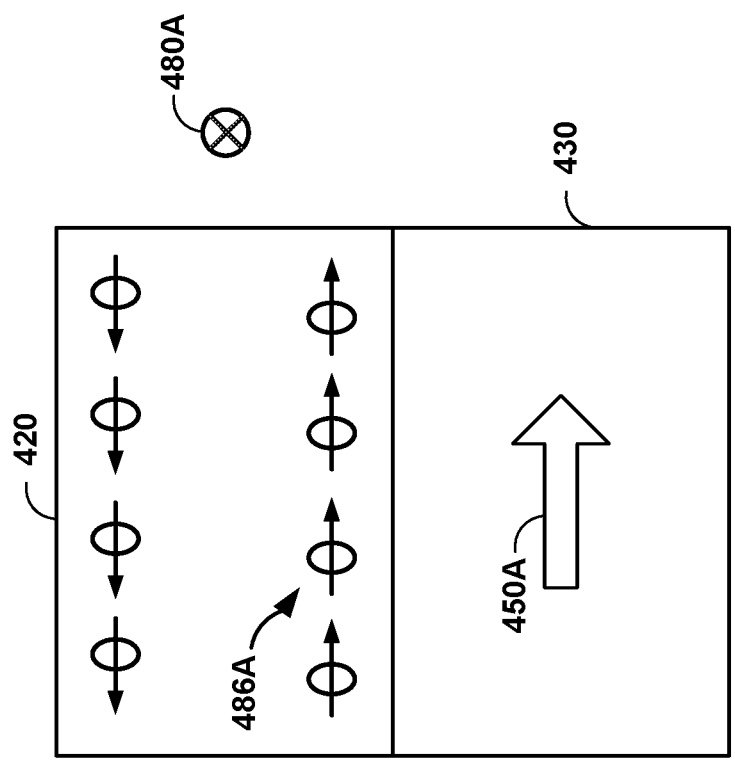

FIGS. 4A and 4B are conceptual diagrams of a read operation based on a current through a topological material 420, in accordance with examples of the disclosure. The current through topological material 420 is based on the charge trapped at the interface with a dielectric material and magnetization state 450A or 450B of ferromagnetic material 430. The orientation of magnetization state 450A or 450B will give rise to second harmonic resistance based on uni-directional spin hall magnetoresistance, spin orbit torque, and/or anomalous Nernst effect.

In examples in which current 480A or 480B passes through topological material 420, a spin current may be generated in the vertical direction. The spin polarized electrons accumulate at the interface of materials 420 and 430. The relative orientations of the spin polarized electrons and magnetization state 450A or 450B results in a resistance. For example, spin polarized electrons 486A are parallel with magnetization state 450A, which results in low resistance. Spin polarized electrons 486B are antiparallel with magnetization state 450B, which results in high resistance.

FIGS. 5A-5D are conceptual diagrams of write operations to switch the magnetization of a ferromagnetic material 530, in accordance with examples of the disclosure. Processing circuitry may be configured to write a bit to ferromagnetic material 530 by applying a large drain voltage to create a spin-orbit torque. As current 580A passes through topological material 520, spin polarized electrons 586A accumulate at the interface of materials 520 and 530. Spin polarized electrons 586A are antiparallel with magnetization state 550A, which causes a high resistance. If there is a sufficiently large voltage applied across topological material 520, spin polarized electrons 586A may be cause magnetization state 550A to switch to magnetization state 550B.

As current 580C passes through topological material 520, spin polarized electrons 586C accumulate at the interface of materials 520 and 530. Spin polarized electrons 586C are antiparallel with magnetization state 550C, which causes a high resistance. If there is a sufficiently large voltage applied across topological material 520, spin polarized electrons 586C may be cause magnetization state 550 to switch to magnetization state 550C.

FIGS. 6A and 6B are graphs of current through a topological material based on the data bits stored in a memory device, in accordance with examples of the disclosure. FIGS. 6A and 6B show that four different current amplitudes all possible for the read-out drain-source current of a hybrid charge-trap transistor of this disclosure. FIG. 6A depicts the read-out based on the value of the two data bits stored by a charge-trap transistor device. In the example shown in FIG. 6A, the first data bit represents the electric charge trapped at the interface of a dielectric material and a topological material, and the second data bit represents the magnetization state of a ferromagnetic material. For device 300 shown in FIG. 3, the change in resistivity due to the electric charge trapped at the interface of the dielectric material and the topological material is greater than the change in resistivity due to the magnetization state of the ferromagnetic material. Other devices described herein may have a greater change in resistivity due to the magnetization state of the ferromagnetic material than due to the electric charge trapped at the interface of the dielectric and topological materials.

FIG. 6B is a plot of the drain current as a function of the gate voltage. Line 680 represents the current at gate voltages less than threshold level 670, where the drain current is not based on trapped charge or a magnetization state of ferromagnetic material. Lines 682 and 683 represent two drain currents based on the sign of the trapped charges when the spin polarized electrons are parallel to the magnetization state of the ferromagnetic material. Lines 684 and 685 represent two drain currents based on the sign of the trapped charges when the spin polarized electrons are antiparallel to the magnetization state of the ferromagnetic material. Lines 682-685 represent the hysteresis caused by trapped charges.

Line 688 represents the drain current for voltages greater than threshold level 672 when the spin polarized electrons are parallel to the magnetization state of the ferromagnetic material. Line 689 represents the drain current for voltages greater than threshold level 672 when the spin polarized electrons are antiparallel to the magnetization state of the ferromagnetic material.

Figure 7A:
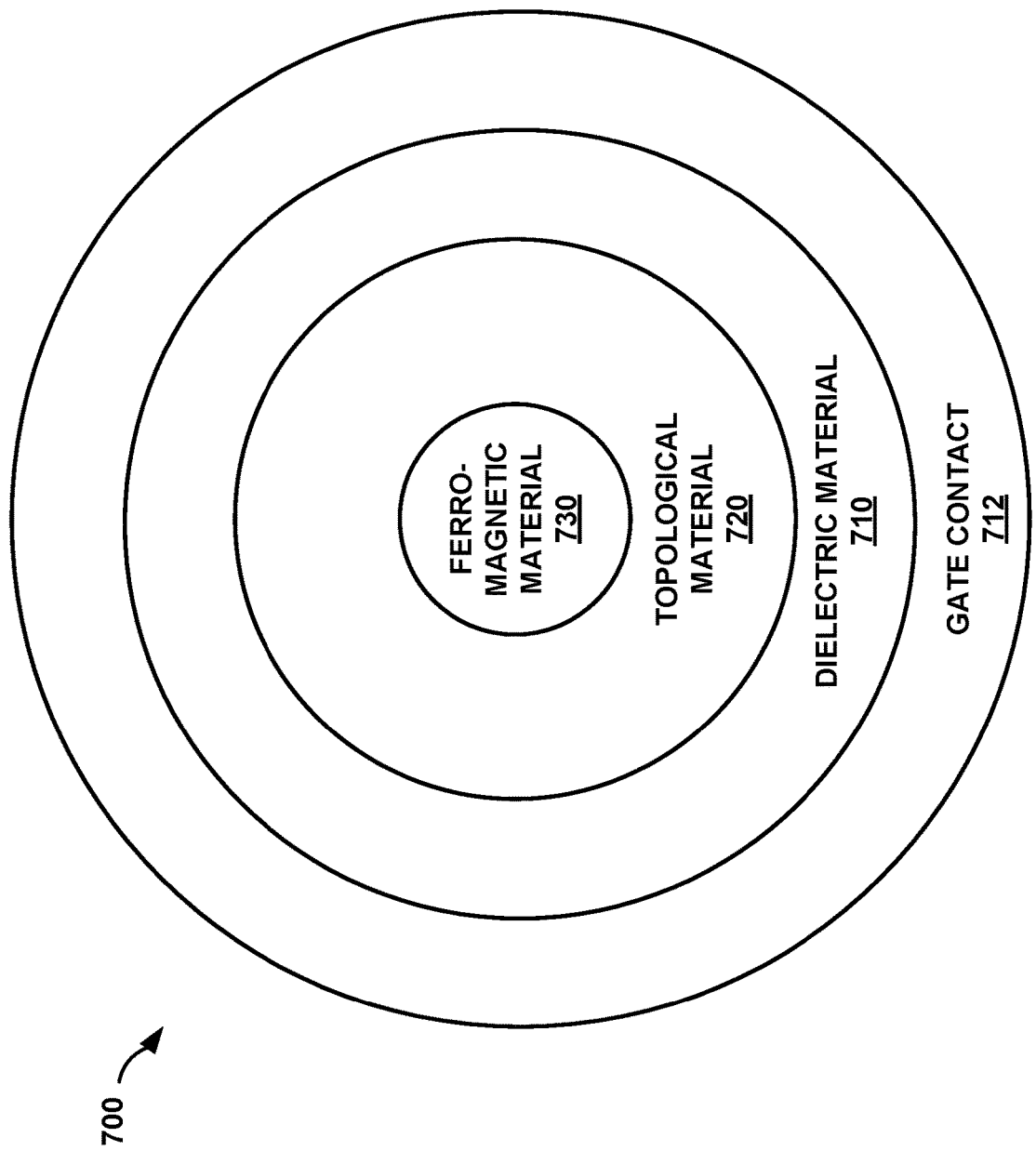
FIGS. 7A and 7B are conceptual block diagrams of a vertical charge-trap transistor device including a ferromagnetic layer, in accordance with examples of the disclosure.
Figure 7B:
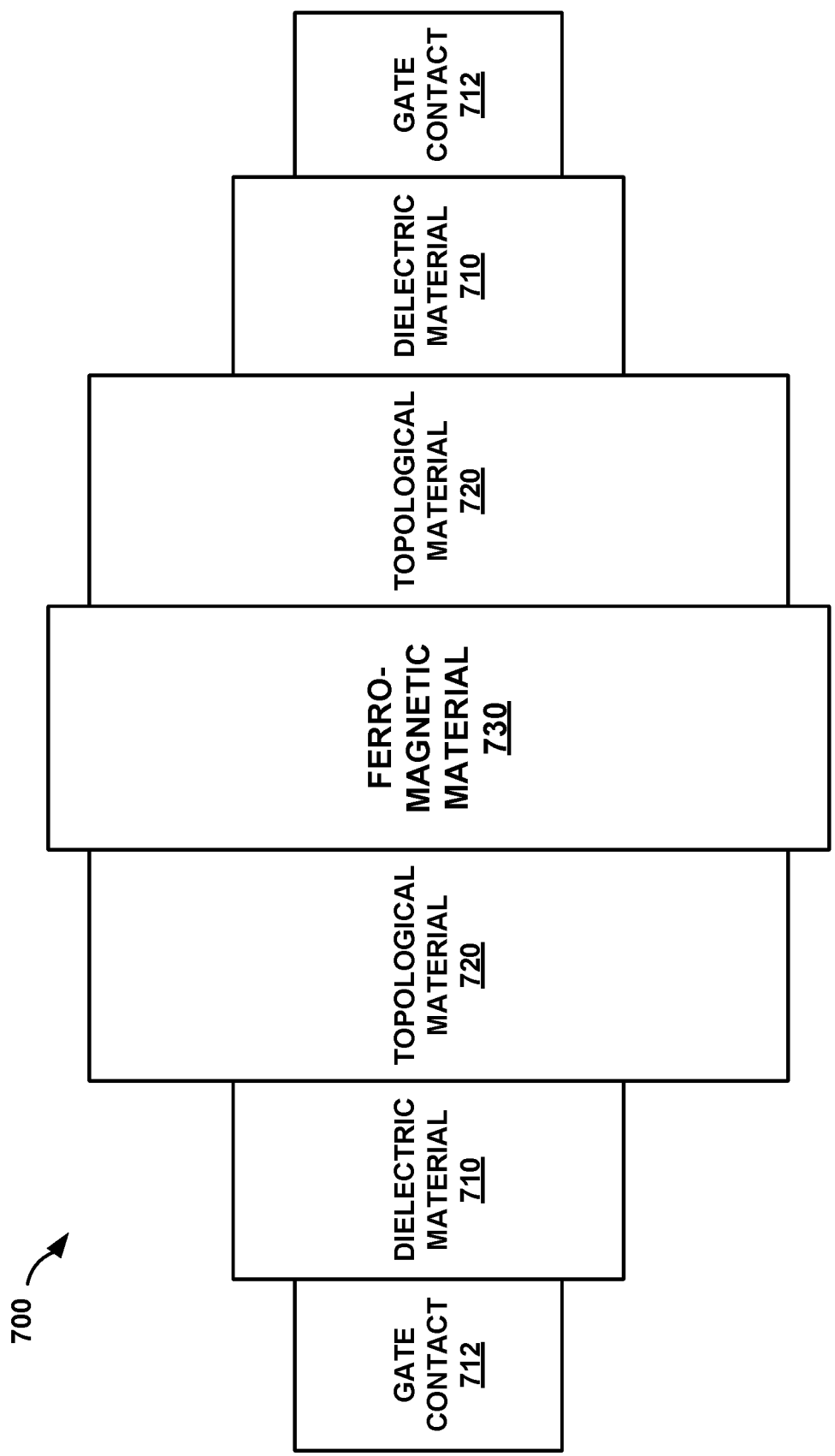

FIGS. 7A and 7B are conceptual block diagrams of a vertical charge-trap transistor device including a ferromagnetic layer, in accordance with examples of the disclosure. FIG. 7A is a top-down view of device 700, which includes dielectric material 710, gate contact 712, topological material 720, and ferromagnetic material 730. Device 700 is a vertical nanowire implementation similar to device 300 shown in FIG. 3, where ferromagnetic material 730 extends in the vertical directions and is circumferentially surrounded by topological material 720 in the horizontal directions. Constructing device 700 may not require a seed layer or a substrate because device 700 is a vertical device. Topological material 720 may be especially suited for vertical device 700 because of the polycrystalline structure of topological material 720.

Ferromagnetic material 730 may be positioned at the center of device 700. Ferromagnetic material 730 may have a clockwise or counter-clockwise magnetization state orientation that is switched by the spin current generated in topological material 720. Topological material 720 may be circumferentially surrounded by dielectric material 710 in the horizontal directions, and dielectric material 710 may be circumferentially surrounded by gate contact 712 in the horizontal directions. FIG. 7B is a cross-sectional side view of device 700, showing ferromagnetic material 730 extending through topological material 720. Although materials 710, 712, and 720 are shown in FIG. 7A as fully surrounding ferromagnetic material 730, material 710, 712, 720 may partially surround ferromagnetic material 730 in some examples (e.g., in a semicircular shape).

Figure 8:
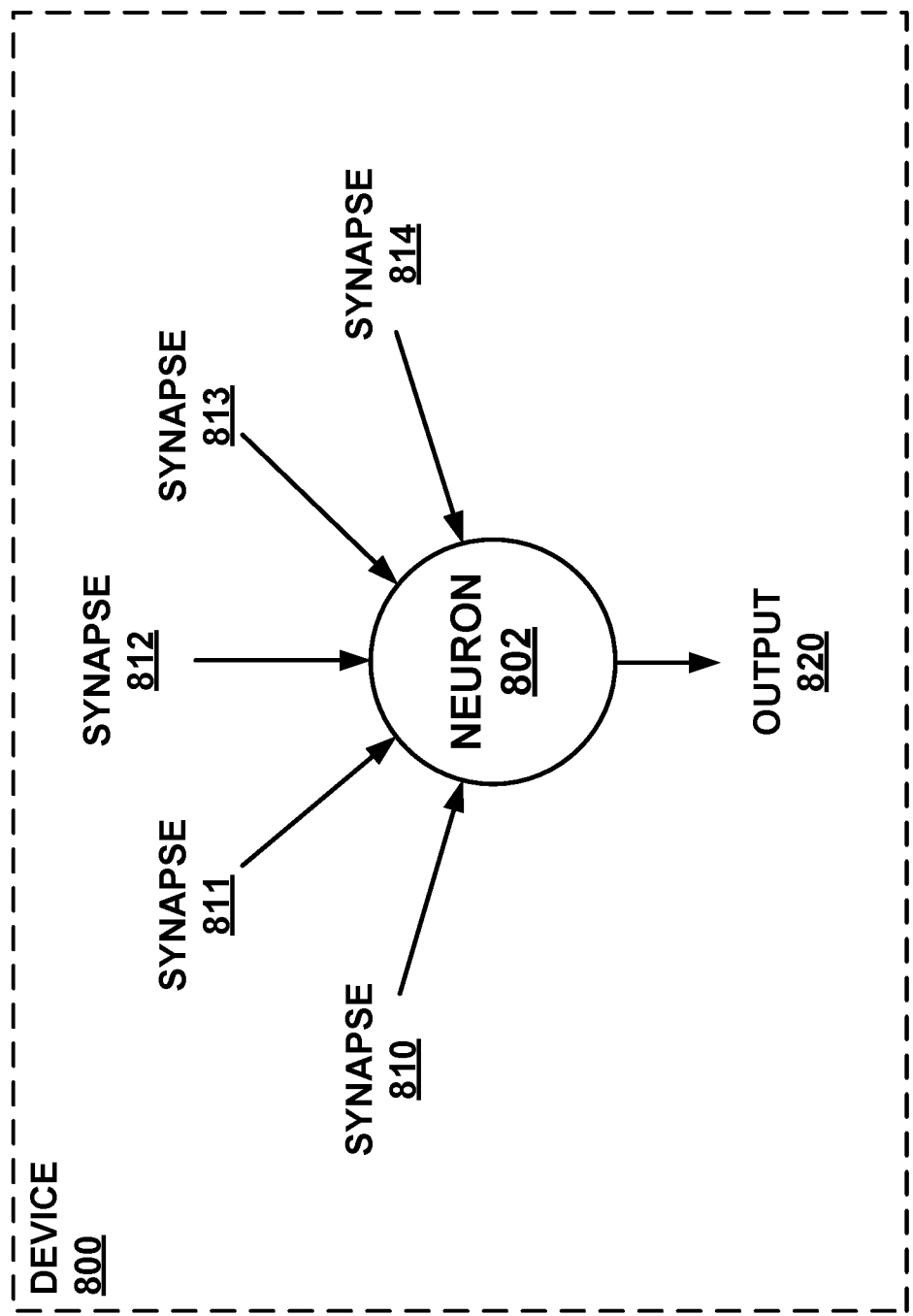
FIG. 8 is a conceptual diagram of a neuromorphic computing device, in accordance with examples of the disclosure.

FIG. 8 is a conceptual diagram of a neuromorphic computing device 800, in accordance with examples of the disclosure. Neuromorphic computing device 800 includes neuron 802 and synapses 810-814. The charges trapped at the interface of a dielectric material and a topological material may operate as one or more of synapses 810-814, especially an analog synapse. The ionic movement may mimic the hardware of a human brain very well.

The magnetization state of a ferromagnetic material can operate as a stochastic synapse or as neuron 802. A stochastic synapse is a system where the synaptic weights are given by probability rather than by analog amplitudes. Thus, a stochastic synapse may use binary memory bits. Every synapse has a weight that the synapse multiplies with an input to generate an output. Analog synapse can have any number between zero and one for the synaptic weight. A stochastic synapse generates a zero or one, but the probability of zero or one can be used to assign an analog value. The stochastic synapse gives a weight by probability rather than an amplitude.

Combining a charge-trap transistor and a ferromagnetic material allows for either a device with an analog synapse and a stochastic synapse or a device with an analog synapse and a neuron. Each of synapses 810-814 may have local memory, and both a charge-trap transistor and a ferromagnetic material have local memory.

Neuron 802 may be configured to generate output 820 based on the inputs received from synapses 810-814. In some examples, every time one of synapses 810-814s fires, neuron 802 spikes, which is called a spiking neural network. A spin-transfer torque oscillator or a spin Hall nano oscillator can operate as neuron 802. In some examples, neuron 802 may assign a weight to each of the inputs received from synapses 810-814. Neuron 802 may be configured to generate output 820 based on the weighted value of the inputs received from synapses 810-814.

Figure 9:
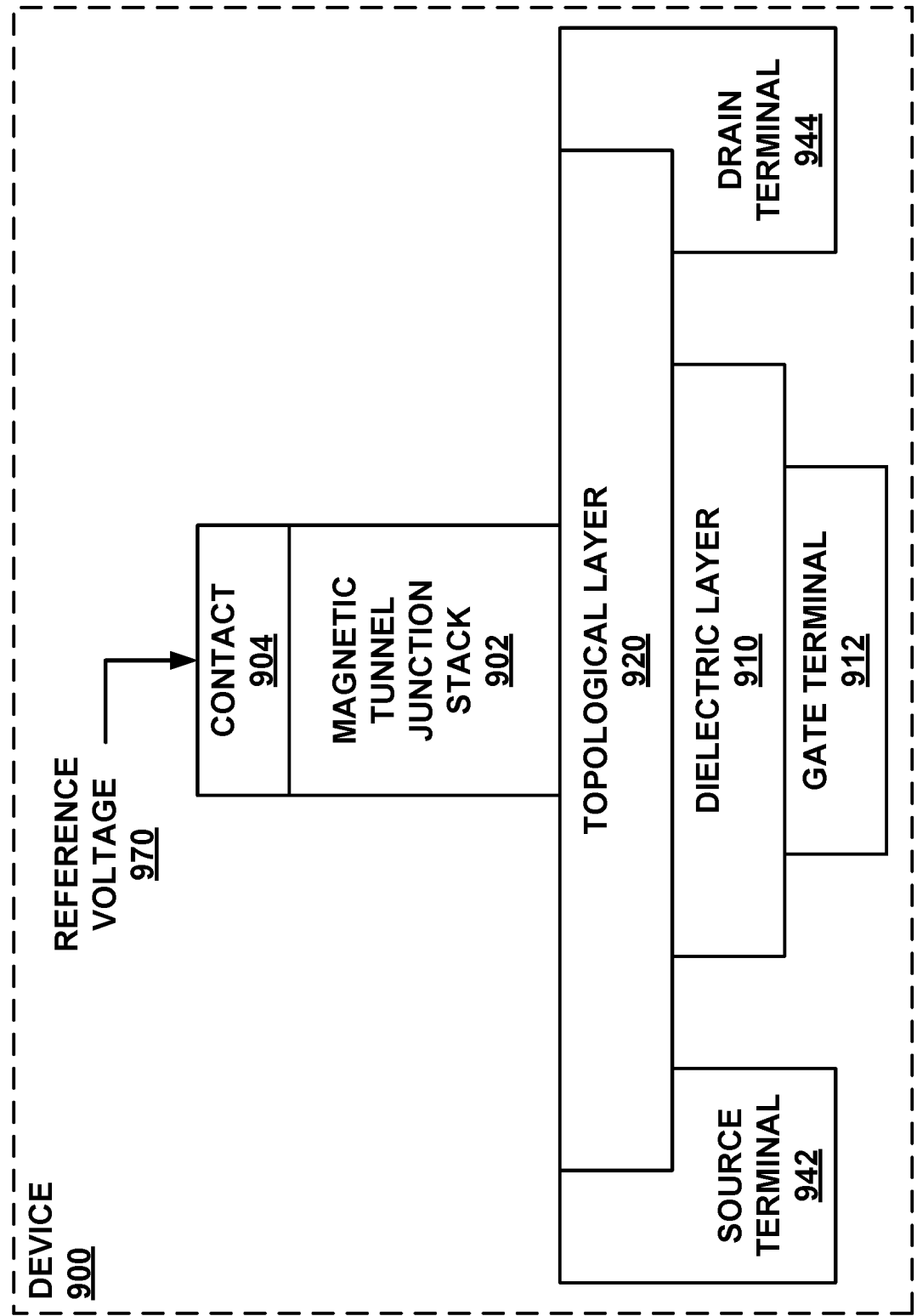
FIG. 9 is a conceptual block diagram of a charge-trap transistor device including a magnetic tunnel junction stack, in accordance with examples of the disclosure.
Figure 10:
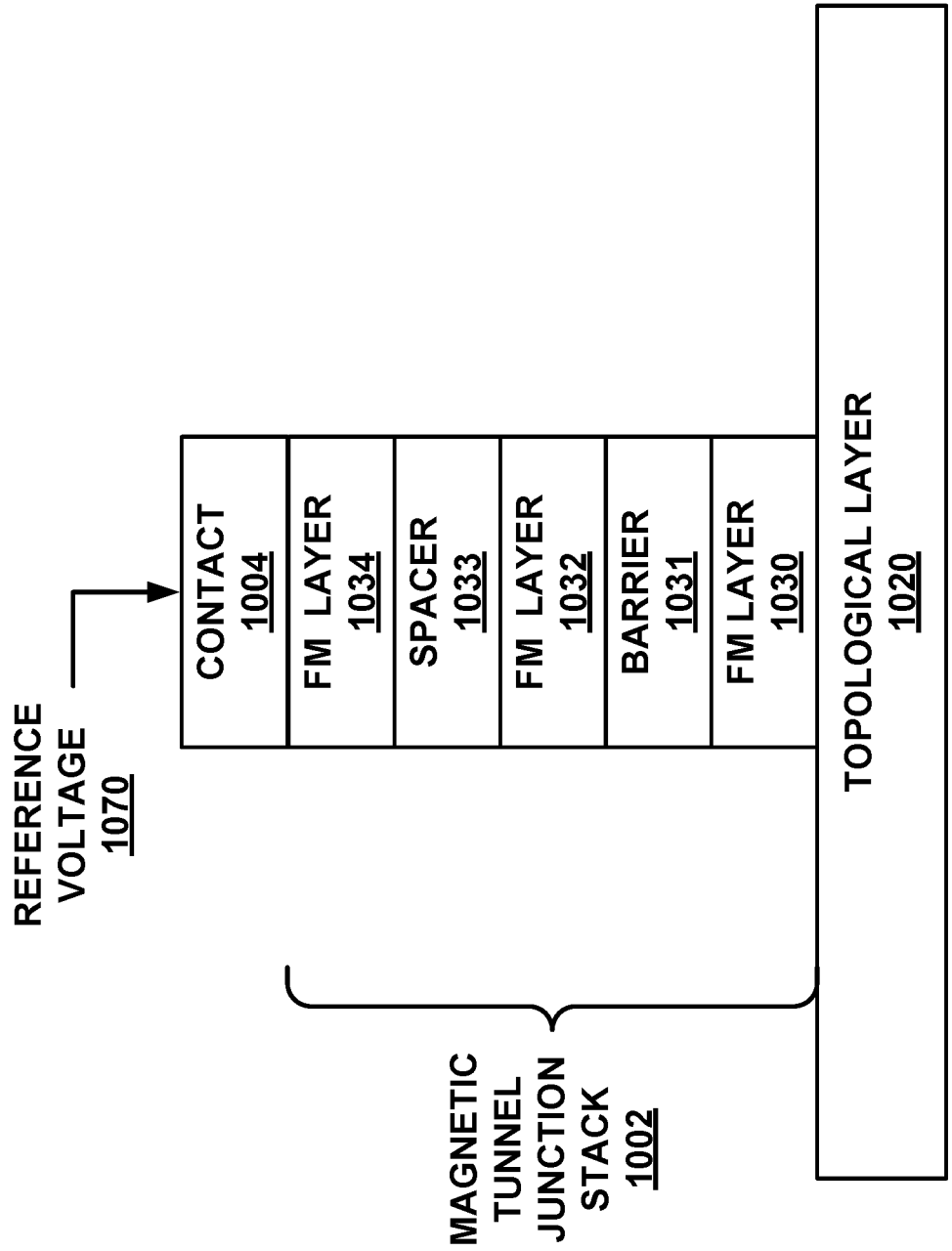
FIGS. 10 and 11 are conceptual block diagrams of two example magnetic tunnel junction stacks, in accordance with examples of the disclosure.
Figure 11:
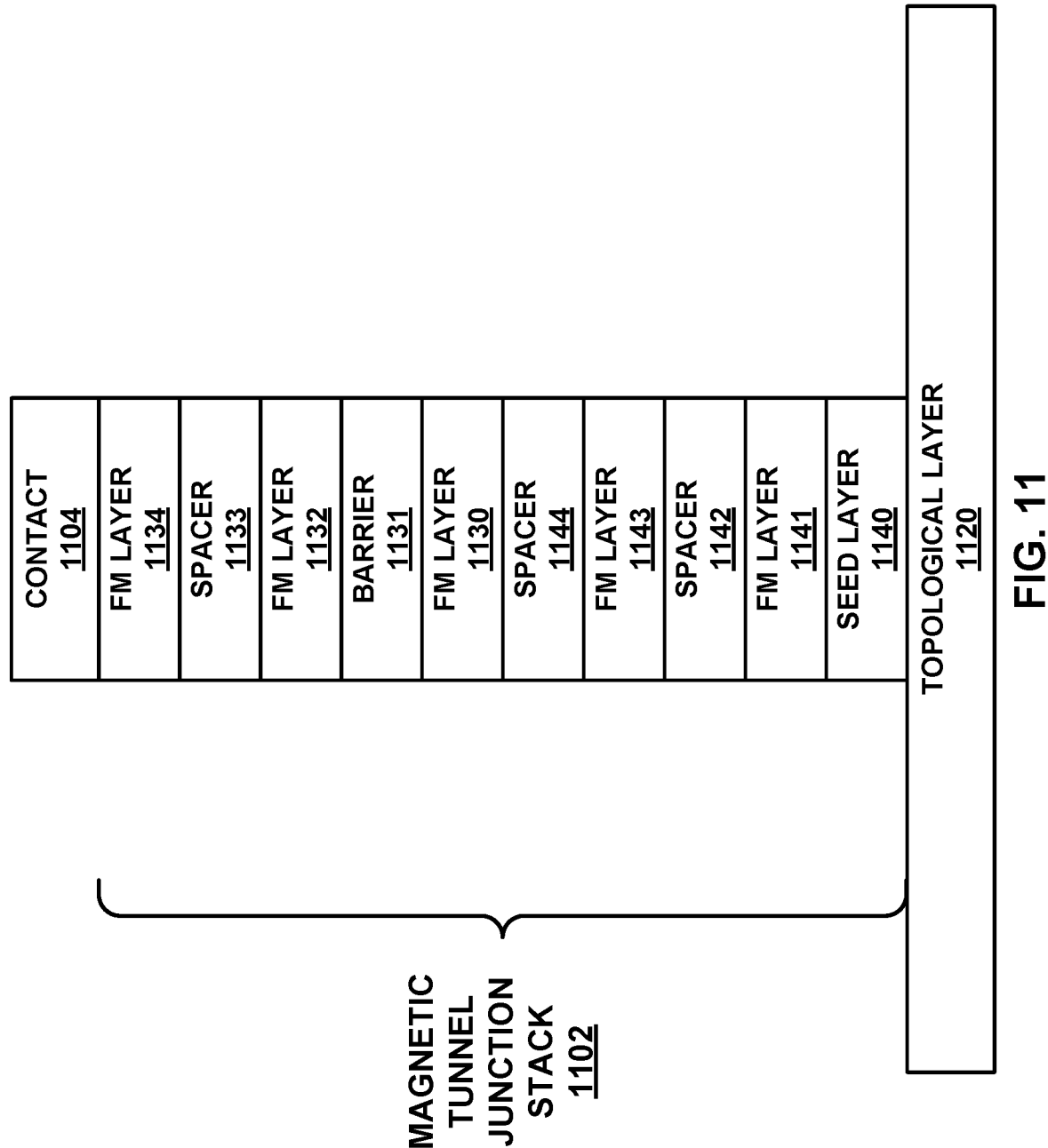

FIG. 9 is a conceptual block diagram of a charge-trap transistor device 900 including a magnetic tunnel junction stack 902, in accordance with examples of the disclosure. Magnetic tunnel junction stack 902 positioned between gate contact 904 and topological layer 920. Examples of magnetic tunnel junction stack 902 are shown in FIGS. 10 and 11. Device 900 also includes dielectric layer 910 and terminal 912, 942, and 944. Topological layer 920 may be a shared, common layer that is part of the charge-trap transistor that includes dielectric layer 910 and part of the magnetic memory that includes magnetic tunnel junction stack 902.

Similar to devices 200, 300, and 700 shown in FIGS. 2, 3, and 7, device 900 can store a first data bit in the charges trapped at the interface of layers 910 and 920. Processing circuitry may be configured to write the first data bit by modulating a gate voltage applied to gate terminal 912. Device 900 can store a second data bit in the magnetization state of one or more layers of magnetic tunnel junction stack 902. The processing circuitry may be configured to write the second data bit by modulating the voltage(s) applied to terminals 942 and/or 944. The second data bit may have a stronger effect than the first data bit on the current passing through topological layer 920. In some examples, reference voltage 970 may be applied to contact 904 and to source terminal 942. Additional example details of magnetic tunnel junction stacks are described in commonly assigned U.S. patent application Ser. No. 16/861,869, entitled "Electric Field Switchable Magnetic Devices," filed on Apr. 29, 2020, and U.S. Pat. No. 10,586,579, entitled "Electric Field Switchable Magnetic Devices," issued on Mar. 10, 2020, the entire contents of each of which are incorporated herein by reference.

FIGS. 10 and 11 are conceptual block diagrams of two example magnetic tunnel junction stacks 1002 and 1102, in accordance with examples of the disclosure. In the example of magnetic tunnel junction stack 1002, a data bit may be stored based on the magnetization state of ferromagnetic layer 1030. Processing circuitry may be configured to change the magnetization state of ferromagnetic layer 1030 by modulating a drain voltage to control a current through topological layer 1020. The spin current generated in topological layer 1020 may switch the magnetization state of ferromagnetic layer 1030. Like device 300 shown in FIG. 3, switchable ferromagnetic layer 1030 is adjacent to topological layer 1020. In contrast, switchable ferromagnetic layer 1130 is not directly in contact with topological layer 1120 shown in FIG. 11.

Each of ferromagnetic layers 1030, 1032, and 1034 may have in-plane anisotropy. Ferromagnetic layer 1032 may have a fixed magnetization state that can be parallel or antiparallel to the magnetization state of ferromagnetic layer 1030. Barrier 1031 may be thin enough to allow tunneling of electrons between ferromagnetic layers 1030 and 1032. Layers 1032, 1033, and 1034 may form a synthetic antiferromagnet.

In the example of magnetic tunnel junction stack 1102, a data bit may be stored based on the magnetization state of ferromagnetic layer 1130. Processing circuitry may be configured to change the magnetization state of ferromagnetic layer 1130 by modulating a drain voltage to control the voltage across magnetic tunnel junction stack 1102 to cause spin transfer torque, voltage-controlled magnetic anisotropy, and/or voltage-controlled exchange coupling to switch the magnetization state of ferromagnetic layer 1130.

Each of ferromagnetic layers 1130, 1132, and 1134 may have perpendicular anisotropy. Ferromagnetic layer 1132 may have a fixed magnetization state that can be parallel or antiparallel to the magnetization state of ferromagnetic layer 1130. Barrier layer 1131 may be thicker than barrier layer 1031 but still thin enough to allow tunneling of electrons between ferromagnetic layers 1130 and 1132. A relatively thick barrier layer 1131 can lead to high charge accumulation across barrier layer 1131, making it easier to switch magnetization state of ferromagnetic layer 1130 by spin transfer torque. Layers 1132, 1133, and 1134 may form a synthetic antiferromagnet. Seed layer 1140 can be used to grow ferromagnetic layer 1141.

Ferromagnetic layers 1030, 1032, 1034, 1130, 1132, 1134, 1141, and 1143 may include, for example, a CoFeB alloy, such as $Co_{20}Fe_{60}B_{20}$; a CoFe alloy, Co, Fe, a Co-based Heusler alloy, a Mn-based alloy, Mn—Ga, Mn—Ge, Mn—Ge—N, or a Fe—Pd alloy. Barrier layers 1031 and 1131 may include a suitable dielectric material, such as, for example, an insulator, such as an oxide. Suitable oxides include MgO, $AlO_x$, $MgAlO_x$, $MgAl_2O_4$, $HfO_x$, $MgZn_2O_4$, $MgNi_2O_4$, ferroelectric materials, 2D materials (e.g., BN), $BiFeO_3$, $BaTiO_3$, and/or lead magnesium niobate-lead titanate (PMN-PT). Spacer layers 1033, 1133, and 1142 may include, for example, Ru, Ir, Ta, Cr, W, Mo, V, MgO, Re, Rh, Hf, Zr, CoO, $Fe_2O_3$, semiconductor materials (e.g., FeSi, AsMnGa, Ge), oxide materials (e.g., NiO), or the like, or any combination of two or more of these materials. Seed layer 1140 may include Cr, Pt, Pd, a Cr/Pt, Cr/Pd, Cr/Ru bilayer, semiconductor materials, oxides, or the like.

Figure 12B:
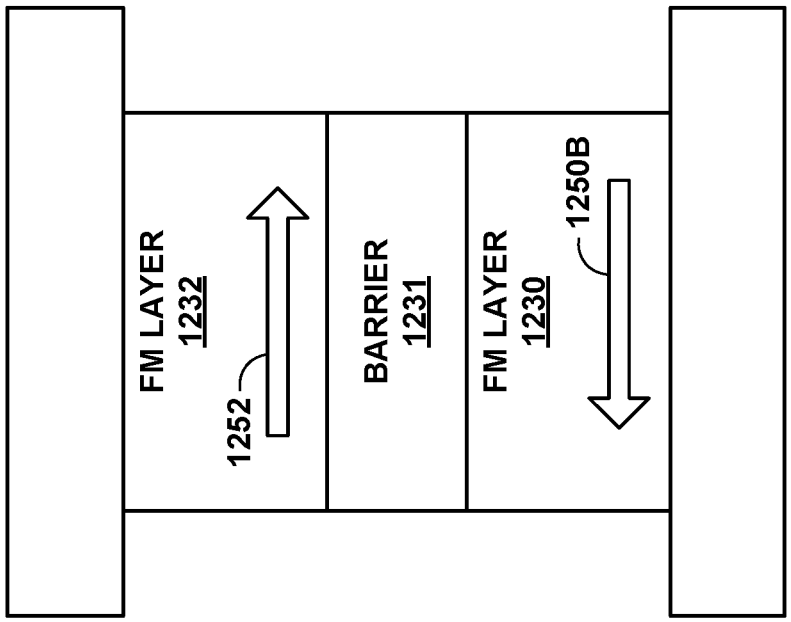
FIGS. 12A and 12B are conceptual diagrams of a magnetic tunnel junction, in accordance with examples of the disclosure.
Figure 12A:
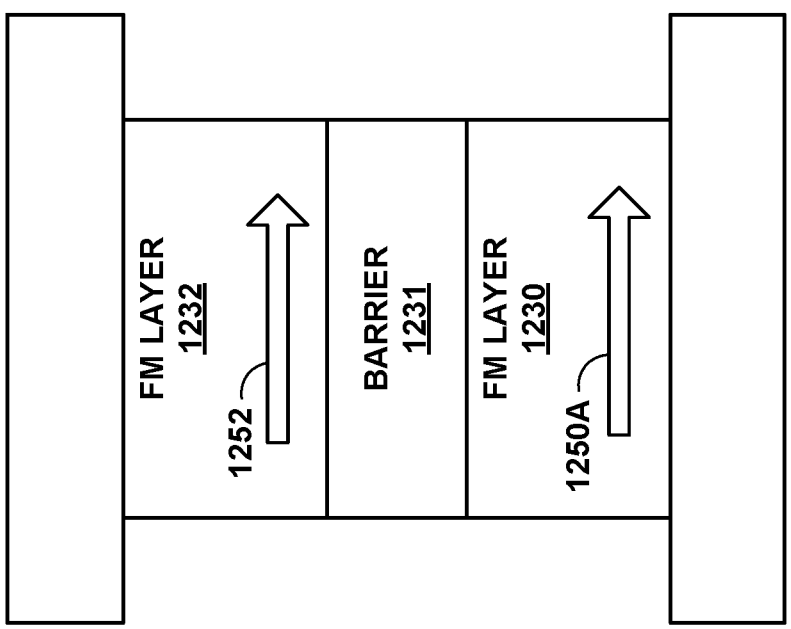

FIGS. 12A and 12B are conceptual diagrams of a magnetic tunnel junction, in accordance with examples of the disclosure. The magnetic tunnel junction includes ferromagnetic layers 1230 and 1232 separated by barrier layer 1231. When a charge current is passed through the sandwich structure of the magnetic tunnel junction, the resistance depends on whether the magnetization states of ferromagnetic layers 1230 and 1232 are parallel or antiparallel. Parallel magnetization states 1250A and 1252 results in low resistance, and antiparallel magnetization states 1250B and 1252 results in high resistance. Although shown as left-right orientations, magnetization states 1250A, 1250B, and 1252 may instead have up-down orientations. The charge current becomes spin polarized while passing through ferromagnetic layers 1230 and 1232. The relative orientation of the spin and magnetization will either produce low or high resistance. This property is called tunneling magnetoresistance.

Processing circuitry may be configured to switch the magnetization state of ferromagnetic layer 1230 by modulating a drain voltage to control the voltage across the magnetic tunnel junction. The direction of the current through the magnetic tunnel junction is based on the drain voltage. A strong enough current can write a data bit by switching the magnetization state by spin transfer torque.

Figure 13:
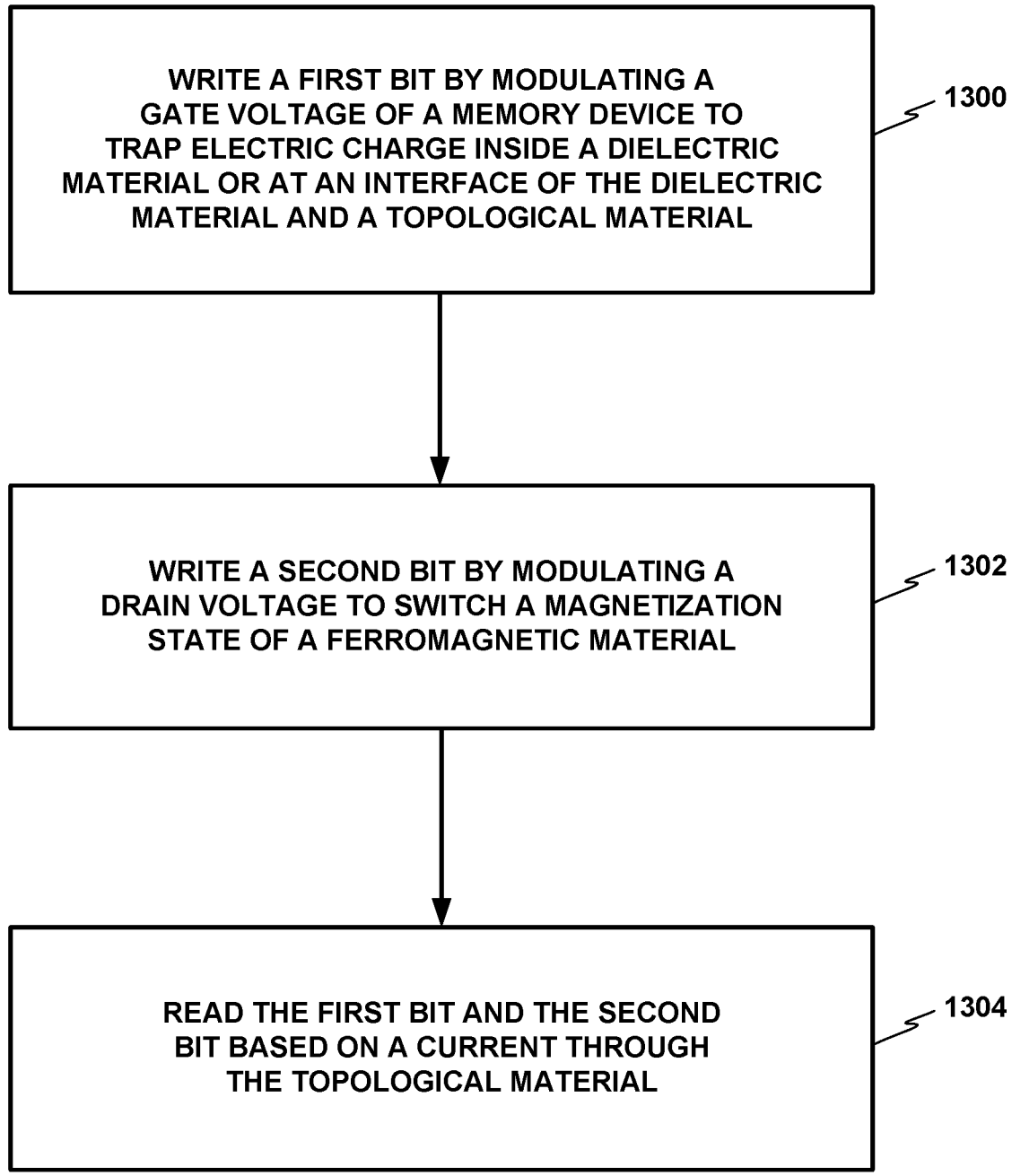
FIG. 13 is a flowchart illustrating example techniques for writing and reading bits to a charge-trap transistor device, in accordance with examples of the disclosure.

FIG. 13 is a flowchart illustrating example techniques for writing and reading bits to a charge-trap transistor device, in accordance with examples of the disclosure. The example techniques of FIG. 13 are described with respect to device 100 and processing circuitry 108 shown in FIG. 1, although other components and devices such as devices 200, 300, 700, and 900 shown in FIGS. 2, 3, 7A, 7B, and 9 may perform similar techniques.

In the example of FIG. 13, processing circuitry 108 writes a first data bit by modulating voltage 160 to trap charges 142 and 144 at interface 140 (1300). Processing circuitry 108 may be configured to apply voltage 160 having a positive sign through a gate contact to a first surface of dielectric material 110, where the first surface is opposite from interface 140. Voltage 160 may attract negative charges to the first surface of dielectric material 110, leaving positive charges 142 at interface 140. Positive charges 142 may attract negative charges 144 inside topological material 120 at interface 140. The disorganized lattice structure of topological material 120 may allow for negative charges 144 to remain caught in deep traps that form at interface 140 even after processing circuitry 108 ceases to apply voltage 160.

Processing circuitry 108 writes a second data bit by modulating voltage 192 to switch magnetization state 150 of ferromagnetic material 130 (1302). By modulating voltage 192, processing circuitry 108 can control the spin current generated in topological material 120. The spin current can accumulate at the interface of materials 120 and 130, causing magnetization state 150 to switch. In examples in which ferromagnetic material 130 is not in direct contact with topological material 120, the voltage across ferromagnetic material 130 can cause magnetization state 150 to switch through the effects of spin transfer torque, voltage-controlled exchange coupling, and/or voltage-controlled magnetic anisotropy.

Processing circuitry 108 reads the first and second data bits based on current 180 through topological material 120 (1304). Processing circuitry 108 may be configured to modulate voltage 192 to a predetermined read voltage level to cause current 180 to flow through topological material 120. The predetermined read voltage level may have a lower amplitude than the voltage level for writing the second data bit. The amplitude of current 180 may indicate the values of the first and second data bits because the charges trapped at interface 140 will increase or reduce the resistance of topological material 120. In addition, magnetization state 150 will increase or reduce the resistance of topological material 120, thereby affecting the amplitude of current 180.

As described herein, the techniques of this disclosure may also for storing two bits in a three-terminal device 100. The techniques also allow for synergies between a charge-trap transistor and an MRAM cell because topological material 120 may be particularly good at trapping charges 142 and 144 and also particularly good at generating spin current. Thus, device 100 may have a reduced size and complexity, as compared to a charge-trap transistor and an MRAM cell that are combined without use of a topological material.

TABLE I

Comparison of devices 300, 700, and 900

| | Read detection (magneto-resistance ratio) | Write current (A/cm$^2$) | Density |
|---|---|---|---|
| Flash | n/a | n/a | High |
| STT-MRAM | ≈100 | $10^8$ | High |
| SOT-MRAM | <1 | $10^5$ | High |
| SHA-MRAM | ≈100 | $10^5$ | Low |
| Device 300 | <1 | $10^5$ | Very high |
| Device 700 | <1 | $10^5$ | Very high |
| Device 900 with stack 1002 | ≈100 | $10^5$ | High |
| Device 900 with stack 1102 | ≈25 | $10^5$ | High |

Table I compares the devices described in this disclosure to existing devices. As compared to an existing spin-transfer torque MRAM device, devices 300, 700, and 900 may consume less write current. Device 900 using magnetic tunnel junction stack 1002 shown in FIG. 10 may have a very good read detection ratio, as compared to a spin-orbit torque device. Device 900 using magnetic tunnel junction stack 1102 shown in FIG. 11 may have a good read detection ratio. Devices 300 and 700 (especially device 700) may have improved density, as compared to existing devices.

In contrast, the existing devices shown in Table I each suffer from deficiencies. For example, spin-transfer torque MRAM may have high density and a good read-out ratio, but spin-transfer torque MRAM may consume large amounts of power for writing data. Spin-orbit torque MRAM may consume less power for writing data than spin-transfer torque MRAM, but the read-out ratio is worse than spin-transfer torque MRAM. Spin Hall assisted MRAM may consume less power for writing data than spin-transfer torque MRAM, but spin Hall assisted MRAM has lower density (e.g., requires a larger area) than spin-transfer torque MRAM.

Various examples of the disclosure have been described. Any combination of the described systems, operations, or functions is contemplated. These and other examples are within the scope of the following claims.

What is claimed is:

1. A device comprising:
a dielectric material;
a ferromagnetic material; and
a topological material positioned between the dielectric material and the ferromagnetic material,
wherein the device is configured to trap electric charge inside the dielectric material or at an interface of the dielectric material and the topological material, and
wherein the device is configured to switch a magnetization state of the ferromagnetic material based on:
a current through the topological material; or
a voltage in the topological material.

2. The device of claim 1, further comprising a charge-trap transistor including a source terminal and a drain terminal,
wherein the ferromagnetic material is a first ferromagnetic region configured to operate as the drain terminal of the charge-trap transistor,
wherein the device further comprises a second ferromagnetic region configured to operate as the source terminal of the charge-trap transistor, and
wherein the topological material is positioned between the first ferromagnetic region and the second ferromagnetic region.

3. The device of claim 2,
wherein the topological material comprises a lateral topological layer,
wherein the interface of the dielectric material and the topological material is on a first surface of the lateral topological layer,
wherein the first ferromagnetic region is positioned on a second surface of the lateral topological layer, the second surface of the lateral topological layer being opposite the first surface of the lateral topological layer, and
wherein the second ferromagnetic region is positioned on the first surface of the lateral topological layer.

4. The device of claim 1,
wherein the ferromagnetic material comprises a lateral ferromagnetic layer,
wherein the lateral topological layer is positioned on the lateral ferromagnetic layer, and
wherein the dielectric material comprises a lateral dielectric layer positioned on the lateral topological layer.

5. The device of claim 1,
wherein the ferromagnetic material comprises a ferromagnetic nanowire extending in a first direction,
wherein the topological material surrounds the ferromagnetic material in a second direction and in a third direction,
wherein the second direction and the third direction are orthogonal to the first direction, and
wherein the dielectric material surrounds the topological material in the second direction and in the third direction.

6. The device of claim 1,
wherein the ferromagnetic material is a first ferromagnetic material, and wherein the device further comprises a magnetic-tunnel junction stack including:
a free layer including the first ferromagnetic material;
a tunnel barrier formed on the free layer; and
a second ferromagnetic material formed on the tunnel barrier.

7. The device of claim 6, wherein the first ferromagnetic material is formed on the topological material.

8. The device of claim 6, wherein the magnetic-tunnel junction stack further comprises:
a third ferromagnetic material;
a fourth ferromagnetic material; and
a spacer material positioned between the third and fourth ferromagnetic materials,
wherein the third and fourth ferromagnetic materials and the spacer material are positioned between the topological material and the first ferromagnetic material.

9. The device of claim 1, further comprising processing circuitry configured to:
write a first bit by modulating a gate voltage applied to the dielectric material to trap the electric charge inside the dielectric material or at the interface of the dielectric material and the topological material; and
write a second bit by modulating a drain voltage applied across the topological material to switch the magnetization state of the ferromagnetic material.

10. The device of claim 9, further comprising a thresholding circuit configured to:
receive the current from the topological material; and
generate an output based on the current received from the topological material,
wherein the processing circuitry is further configured to read the first bit and the second bit based on the output generated by the thresholding circuit.

11. The device of claim 1, wherein the topological material comprises bismuth selenide material.

12. The device of claim 1, wherein the device is configured to operate as a neuromorphic computing device.

13. The device of claim 1, wherein the device is configured to operate as an analog synapse including trapping the electric charge inside the dielectric material or at the interface of the dielectric material and the topological material.

14. The device of claim 13, wherein the ferromagnetic material is configured to operate as a stochastic synapse or as a neuron.

15. The device of claim 1,
wherein the topological material is selected from a first group consisting of a topological insulator, a Weyl semimetal, and a Dirac semimetal, and
wherein the topological material is selected from a second group consisting of a crystalline structure material and an amorphous structure material.

16. A method for operating a memory device, the method comprising:
writing a first bit to the memory device by modulating a gate voltage to trap electric charge inside a dielectric material or at an interface of the dielectric material and a topological material;
writing a second bit to the memory device by modulating a drain voltage to switch a magnetization state of a ferromagnetic material; and
reading the first bit and the second bit based on a current through the topological material.

17. The method of claim 16,
wherein the current through the topological material is a first current through the topological material, wherein writing the second bit comprises injecting a second current into the topological material to generate spin current in the topological material, wherein the spin current generated in the topological material causes the magnetization state of the ferromagnetic material to switch.

18. A device configured to operate as a neuromorphic computing device, the device comprising:

gate contact;

a dielectric layer;

a ferromagnetic layer; and a topological layer positioned between the dielectric layer and the ferromagnetic layer, wherein the dielectric layer is positioned between the gate contact and the topological layer, wherein the topological layer comprises a material selected from a group consisting of bismuth selenide, bismuth tellurium, antimony selenide, and antimony tellurium, wherein the device is configured to trap electric charge at an interface of the dielectric layer and the topological layer based on a voltage applied to the gate contact, and wherein the device is configured to switch a magnetization state of the ferromagnetic layer based on a spin current generated in the topological layer.

19. The device of claim 18, wherein the ferromagnetic layer is a first ferromagnetic layer, and wherein the device further comprises a magnetic-tunnel junction stack including:

a free layer including the first ferromagnetic layer;

a tunnel barrier formed on the free layer; and a second ferromagnetic layer formed on the tunnel barrier.

20. The device of claim 18, wherein the device is configured to operate as an analog synapse including trapping the electric charge at the interface of the dielectric layer and the topological layer, and wherein the ferromagnetic layer is configured to operate as a stochastic synapse or as a neuron.

* * * * *